US012777728B2

(12) United States Patent
Lifka et al.

(10) Patent No.: US 12,777,728 B2
(45) Date of Patent: Oct. 27, 2026

(54) PHOTO-VOLTAIC ELEMENT AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Herbert Lifka, Eindhoven (NL); Siegfried Christiaan Veenstra, Heeze (NL); Maarten Sander Dorenkamper, Rosmalen (NL); Hieronymus Antonius Josephus Maria Andriessen, Beerse (BE); Huibert Johan Van Den Heuvel, Eindhoven (NL)

(73) Assignee: Nederlandse Organisatie voor toegepast—natuurwetenschappelijk onderzoek TNO, 's-Gravenhage (NL)

( * ) Notice: Subject to any disclaimer, the term of this patent is extended or adjusted under 35 U.S.C. 154(b) by 313 days.

(21) Appl. No.: 18/370,622

(22) Filed: Sep. 20, 2023

(65) Prior Publication Data

US 2024/0105866 A1 Mar. 28, 2024

Related U.S. Application Data

(62) Division of application No. 16/604,756, filed as application No. PCT/NL2018/050224 on Apr. 12, 2018, now abandoned.

(30) Foreign Application Priority Data

Apr. 13, 2017 (EP) .................................... 17166454

(51) Int. Cl.
*H10F 10/167* (2025.01)
*H10F 71/00* (2025.01)
(Continued)

(52) U.S. Cl.
CPC ........... *H10F 10/167* (2025.01); *H10F 71/00* (2025.01); *H10F 77/147* (2025.01);
(Continued)

(58) Field of Classification Search
None
See application file for complete search history.

(56) References Cited

U.S. PATENT DOCUMENTS

| | | | | |
|---|---|---|---|---|
| 9,786,809 | B2 * | 10/2017 | Masuko | H10F 10/166 |
| 2007/0186971 | A1 | 8/2007 | Lochun et al. | |

(Continued)

FOREIGN PATENT DOCUMENTS

| | | | |
|---|---|---|---|
| CN | 104718637 | A | 6/2015 |
| CN | 105140398 | A | 12/2015 |
| WO | 2016038825 | A1 | 3/2016 |
| WO | 2017060700 | A1 | 4/2017 |

OTHER PUBLICATIONS

Aug. 10, 2018 International Search Report and Written Opinion, PCT/NL2018/050224.

*Primary Examiner* — Alexander G Ghyka
(74) *Attorney, Agent, or Firm* — Banner & Witcoff, Ltd.

(57) ABSTRACT

A photo-voltaic element comprising a stack of layers is disclosed, as well as a method of making the photo-voltaic element. The stack of layers at least includes the following: a first electrode layer, a first charge carrier transport layer, an insulating layer, a second electrode layer, a second charge carrier transport layer, and a photo-electric conversion layer. The photo-electric conversion layer comprises a plurality of distributed extensions extending through the second charge carrier transport layer, the second electrode layer, and the insulating layer, to the first charge carrier transport layer. The distributed extensions have an effective cross-section
(Continued)

$D_{eff}$ in the range of 0.5 to 10 micron, and have an average pitch in the range of 1.1 to 5 times said effective cross-section.

20 Claims, 18 Drawing Sheets

(51) Int. Cl.

| | |
|---|---|
| ***H10F 77/14*** | (2025.01) |
| ***H10F 77/20*** | (2025.01) |
| ***H10K 30/50*** | (2023.01) |
| ***H10K 39/12*** | (2026.01) |
| ***H10K 85/50*** | (2023.01) |

(52) U.S. Cl.
CPC ........... *H10F 77/211* (2025.01); *H10K 85/50* (2023.02); *H10K 30/50* (2023.02); *H10K 39/12* (2023.02)

(56) References Cited

U.S. PATENT DOCUMENTS

| | | | | |
|---|---|---|---|---|
| 2011/0079272 | A1* | 4/2011 | Tokioka | H10F 19/31 438/69 |
| 2012/0048339 | A1 | 3/2012 | Chang et al. | |
| 2012/0187394 | A1* | 7/2012 | Hatano | G02F 1/133514 257/E31.127 |
| 2013/0056876 | A1* | 3/2013 | Harvey | H05K 3/244 257/E29.112 |
| 2015/0048349 | A1* | 2/2015 | Kawata | G06F 1/1652 257/40 |
| 2015/0123094 | A1 | 5/2015 | Kang | |
| 2015/0318477 | A1 | 11/2015 | Irwin et al. | |
| 2016/0118514 | A1* | 4/2016 | Li | H10F 77/211 136/255 |
| 2016/0285023 | A1 | 9/2016 | Oooka et al. | |
| 2018/0286596 | A1 | 10/2018 | Snaith et al. | |

* cited by examiner

S4

S16A

S16B

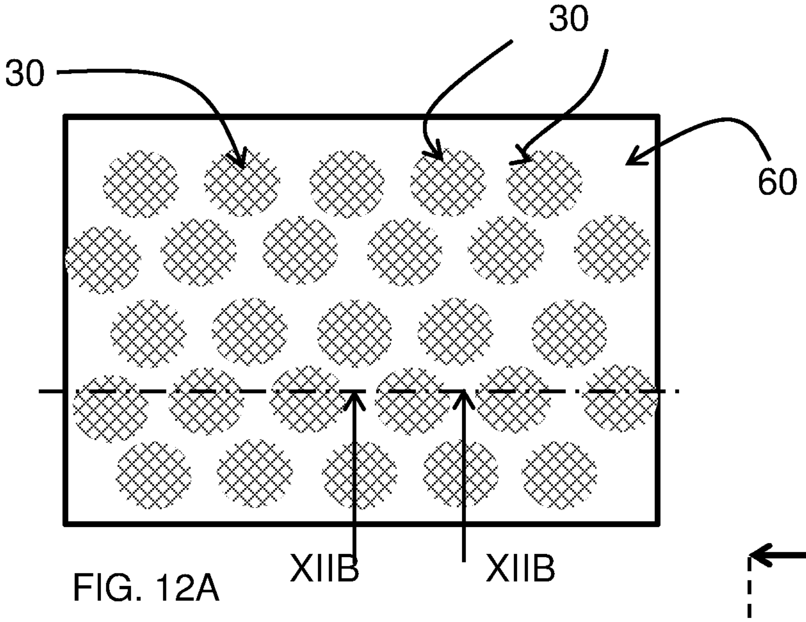
FIG. 12A
S16C
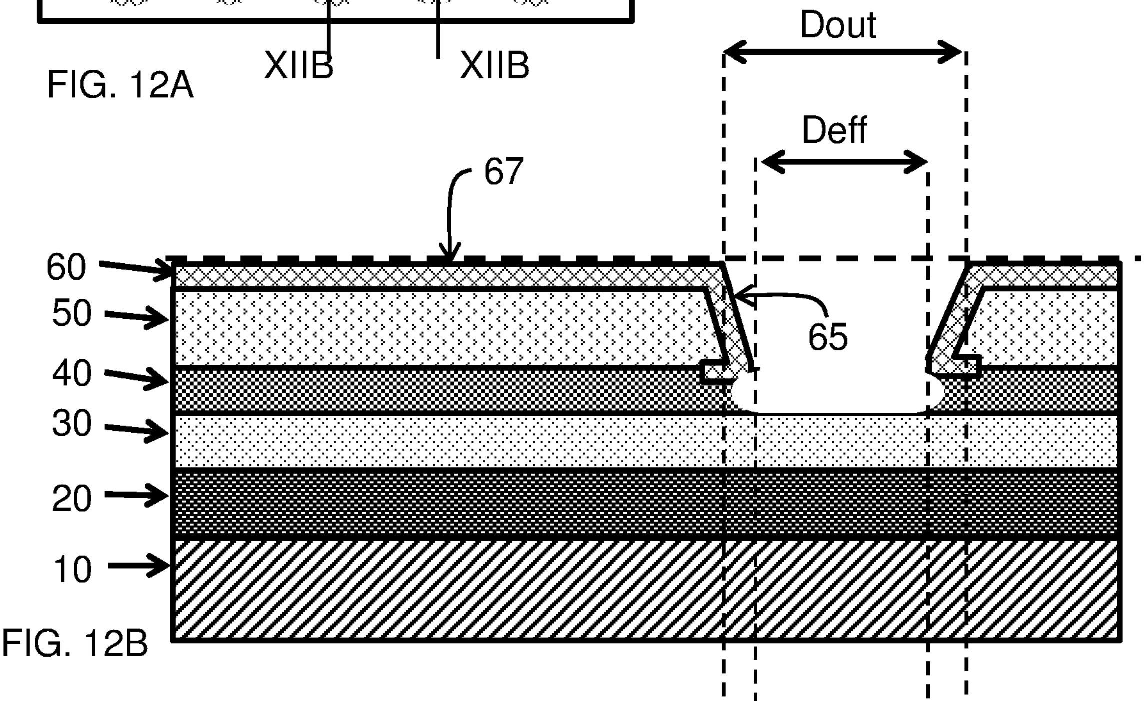
FIG. 12B
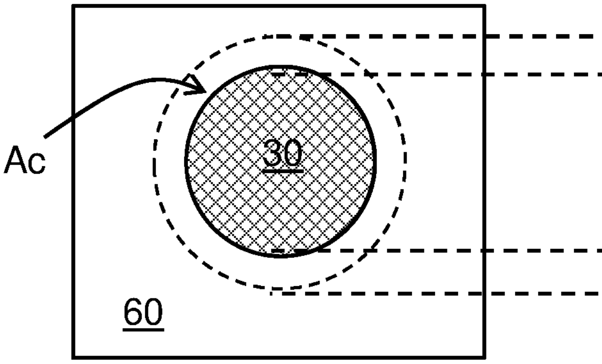
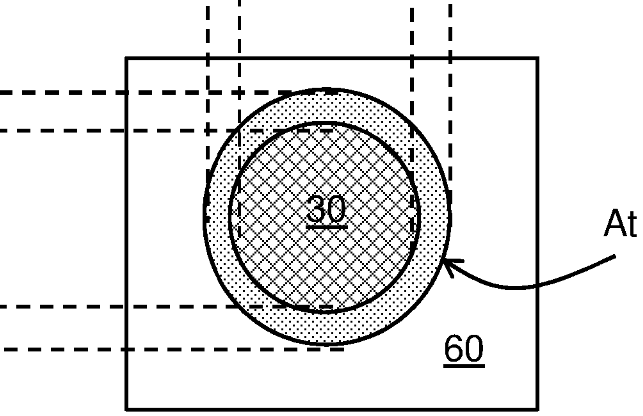
FIG. 12C
FIG. 12D

S17

S26

PHOTO-VOLTAIC ELEMENT AND METHOD OF MANUFACTURING THE SAME

CROSS-REFERENCE TO RELATED APPLICATIONS

This application is a divisional of U.S. application Ser. No. 16/604,756 filed Oct. 11, 2019, which is a U.S. National Stage application under 35 U.S.C. § 371 of International Application PCT/NL2018/050224 (published as WO 2018/190711A1), filed Apr. 12, 2018, which claims the benefit of priority to EP 17166454.3, filed Apr. 13, 2017. Benefit of the filing date of each of these prior applications is hereby claimed. Each of these prior applications is hereby incorporated by reference in its entirety.

FIELD OF THE INVENTION

The present invention pertains to a photo-voltaic element. The present invention further pertains to a method of manufacturing the same.

BACKGROUND OF THE INVENTION

A photo-voltaic element is disclosed in CN105140398 that comprises a conductive substrate; a uniform electron transport layer; a dielectric layer; a metal layer; and a perovskite layer as a photo-electric conversion layer. The latter has a plurality of channels through the dielectric layer and the metal layer that contact the electron transport layer. Accordingly the perovskite photo-electric conversion layer has its electric contacts for delivering electrical energy at the same side. Therewith it can be avoided that light to be converted has to pass through an electrode layer, as a result of which it would be attenuated before conversion.

The cited document also presents a method of manufacturing the photo-voltaic element disclosed therein. Therein a substrate is provided of a transparent conductive glass and an electron transport layer is deposited thereon by magnetron sputtering ZnO. Subsequently a layer of dispersed PS pellets having an original diameter of 2 um is deposited resulting in a hexagonal close-packed structure of said PS pellets. The PS ball diameter is subsequently reduced to 1 um by dry etching using RIE. A dielectric layer of $Al_2O_3$ is deposited thereon using ALD deposition followed by magneton sputtering of an Au layer. Subsequently, using a solvent and an ultrasonic treatment the PS pellets and the portions of the $Al_2O_3$ layer and the Au layer deposited thereon are removed, so that an Au mesh is obtained that is insulated from the electron transport layer. A perovskite layer is spin coated thereon that both contacts the Au mesh and the ZnO electron transport layer.

It is a disadvantage of this known process, a lift-off process, that the patterning process is not well controlled. As a result the boundaries of the openings in the insulator layer and the upper electrode layer are jagged and an unreliable or even non-working product is obtained.

It is noted that WO2017/060700, published after the priority date of this document also uses a lift-off process. As shown for example in FIG. 2, subsequently:

- the patterned resist layer is formed on the lower electrode (a)
- the insulator and HCE layer are deposited thereon (b)
- the patterned resist layer and the portions of the insulator layer and HCE layer present thereon are removed in the lift-off step (c).

SUMMARY OF THE INVENTION

It is a first object of the invention to provide a photo-voltaic element with an improved conversion efficiency.

It is a second object of the invention to provide a method of manufacturing this improved photo-voltaic element.

In accordance with said first object, according to a first aspect, a photo-voltaic element is provided as disclosed herein.

In accordance with said second object, according to a second aspect, a method of manufacturing a photo-voltaic element is provided as further disclosed herein.

An exemplary photo-voltaic element comprises a stack of layers that at least include in the order named: a first electrode layer, a first charge carrier transport layer, an insulating layer, a second electrode layer, a second charge carrier transport layer, and a photo-electric conversion layer.

The first electrode layer is provided for receiving charge carriers of a first polarity, for example electrons, or alternatively for receiving holes as the charge carrier. The first charge carrier transport layer is provided for transport of charge carriers having the first polarity. E.g. if the first electrode layer is a cathode provided for receiving electrons as the charge carrier then the first charge carrier transport layer is an electron transport layer. Alternatively, if the first electrode layer is an anode provided for receiving holes as the charge carrier then the first charge carrier transport layer is a hole transport layer. The insulating layer may be provided of any sufficiently insulating organic or inorganic material. The second electrode layer is provided for receiving charge carriers of a second polarity opposite to the first polarity. Hence if the first electrode layer is a cathode then the second electrode layer is an anode and vice versa. The second charge carrier transport layer is provided for transport of charge carriers having the second polarity. Accordingly the second charge carrier transport layer is a hole transport layer if the second electrode layer is an anode and an electron transport layer if the second electrode layer is a cathode. The photo-electric conversion layer comprises a plurality of distributed extensions that extend through the second charge carrier transport layer, the second electrode layer and the insulating layer to the first charge carrier transport layer.

Because the photo-electric conversion layer is the uppermost layer of the stack (apart from e.g. a protection layer or encapsulation), it is not necessary that the various layers are transparent. Therewith one or more of the electrodes may be formed as a metal layer, for example an aluminum or a copper layer, possibly sandwiched between intermediate layers, e.g. as MoAlMo or CrCUCr. Nevertheless, embodiments may be contemplated wherein a transparent electrically conductive material is used for the electrodes, for example a transparent electrically conductive oxide like ITO. This is advantageous in that the device so obtained is bilaterally sensitive. Alternatively, this may be combined with a substrate having a reflecting surface. In this embodiment, light entering the device that is not converted in the photo-electric conversion layer is reflected back to the latter, so that it can still be (partially) converted.

Therewith the photo-electric conversion layer is electrically coupled to both the first charge carrier transport layer and the second charge carrier transport layer. In this arrangement solar radiation R does not need to traverse an electrode layer or a charge carrier transport layer, which contributes to an efficient operation of the photo-voltaic element.

An optimal conversion efficiency is achieved by the presence of a charge carrier transport layer between the first electrode layer and the photo-electric conversion layer as well as between the second electrode layer and the photo-electric conversion layer.

The extensions have an effective cross-section $D_{eff}$ in the range of 0.5 to 10 micron, and have an average pitch in the range of 1.1 to 5 times their effective cross-section. The effective cross-section is defined here as the diameter of a circle having an area corresponding to the cross-sectional area $A_{\varnothing}$ of the extensions.

I.e.

$$D_{eff} = \sqrt{\frac{4A_{\Phi}}{\pi}}$$

The extensions are typically cylindrical. Alternatively the extensions may taper inward or outward. The extensions may have any cross-section, such as circular, square or triangular. The circumference O of the extensions is less than 10 times the effective diameter $D_{eff}$ and preferably less than 5 times the effective diameter $D_{eff}$. Therewith an optimum contact surface between the photo-electric conversion layer and the first charge carrier transport layer is achieved with minimum disruption of the intermediary layers, in particular the second electrode layer and the second charge carrier transport layer.

In an embodiment of the photo-voltaic element the extensions taper outward in a direction from the first charge carrier transport layer to the second charge carrier layer. In an embodiment thereof, material of the second charge carrier transport layer covers a surface of the second electrode surrounding the extensions. Therewith a contact surface provided for the photovoltaic layer is improved.

In an embodiment, the first charge carrier layer is absent in areas of the first electrode layer covered by the insulating layer. Also in this case, the stack formed in the product is deemed to comprise first charge carrier layer and a subsequent insulating layer, as the surface of the insulating layer will be above a surface of the first charge carrier layer, when traversing the layers starting from the substrate on which the layers are deposited.

In an embodiment the photo-electric conversion layer is provided of a perovskite material. Perovskite materials typical have a crystal structure of $ABX_3$, wherein A is an organic cation as methylammonium $(CH_3NH_3)^{30}$, B is an inorganic cation, usually lead (II) $(Pb^{2+})$, and X is a halogen atom such as iodine $(I^-)$, chlorine $(Cl^-)$ or bromine $(Br^-)$. Perovskite materials are particularly advantageous in that they can be processed relatively easily and in that their bandgap can be set to a desired value by a proper choice of the halide content. A typical example is methylammonium lead trihalide $(CH_3NH_3PbX_3)$, with an optical bandgap between 1.5 and 2.3 eV depending on halide content. Another more complex structure example is Cesium-formamidinium lead trihalide $(Cs_{0.05}(H_2NCHNH_2)_{0.95}PbI_{2.85}Br_{0.15})$ having a bandgap between 1.5 and 2.2 eV. Other metals such as tin may replace the role of Pb in perovskite materials. An example thereof is $CH_3NH_3SnI_3$. Also combinations of Sn with Pb perovskites having a wider bandgap in the range of 1.2 to 2.2 eV are possible. In another embodiment the photo-electric conversion layer is made of copper indium gallium selenide (CIGS).

The geometry of the substantially circular cylindrical extensions with an effective cross-section $D_{eff}$ in the range of 0.5 to 10 micron, and with an average pitch in the range of 1.1 to 5 times their effective cross-section makes it possible to optimally tune the contact-surface of the photo-voltaic layer with the first and the second charge carrier transport layer respectively dependent on the type of perovskite material used for the photo-voltaic layer. This is favorable, in that the ratio of mobility for holes and electrons may differ. E.g. if for a certain perovskite the mobility of electrons is 3 time higher than for holes, the surface area of the HTL preferably is approximately 3× the surface area of the ETL for an optimal efficiency.

The presently disclosed methods enable manufacturing the photo-voltaic elements disclosed herein. Exemplary methods comprise the steps of:

- providing a substrate;
- depositing thereon a stack of layers comprising at least in the order named:
  - a first electrode layer for receiving charge carriers of a first polarity;
  - an insulating layer;
  - a second electrode layer for receiving charge carriers of a second polarity opposite to said first polarity;

wherein the insulating layer and layers subsequently deposited in this step form a sub-stack having an upper surface,

- applying a resist layer on said upper surface, wherein said resist layer is provided with a plurality of distributed openings towards said upper surface, the openings having an effective cross-section D in the range of 0.5 to 10 micron, and having an average pitch in the range of 1.1 to 5 times said effective cross-section,
- etching to selectively remove material of the sub-stack facing the openings,
- removing the resist layer subsequent to said etching,
- depositing and curing a photo-electric conversion layer subsequent to said removing.

The method further comprises depositing a first charge carrier transport layer for transport of charge carriers having the first polarity and depositing a second charge carrier transport layer for transport of charge carriers having said second polarity.

In an embodiment depositing the first charge carrier transport layer is subsequent to depositing the first electrode layer and preceding to depositing the insulating layer and said depositing the second charge carrier layer is subsequent to depositing the insulating layer and preceding depositing the resist layer.

In an embodiment, of the method the second charge carrier transport layer is deposited with an electroplating process and subsequent to removing the resist layer, and preceding depositing and curing a photo-electric conversion layer.

In an embodiment the first charge carrier transport layer is deposited with an electroplating process subsequent to removing the resist layer, and preceding depositing the second charge carrier layer.

The method according to the present invention enables the deposition of a thicker stack of layers on the first charge carrier transport layer than would be possible when using the pellet based approach known from the prior art. In this way the second charge carrier transport layer can be provided, therewith significantly improving efficiency of the photo-voltaic element.

Various methods may be used for depositing and applying layers. These methods may include spin-coating, printing methods, slot-die coating and vapor deposition methods like physical vapor deposition (e.g. E-beam PVD, Sputter PVD), (spatial) Atomic Layer Deposition ((s)ALD), and chemical vapor deposition (e.g. plasma-enhanced chemical vapor deposition (PECVD)).

Etching processes may be applied to remove a material (or a part of the material) from a surface either by a chemical reaction generated by the use of a reactive mix of gases (plasma-etching) or by submerging the substrates in a reactive solution where the layer is removed by dissolution or chemical reaction (wet-etching).

A selective etching is made possible by using a mask that locally protects the underlying layer(s). A patterning in such a mask may be obtained for example by optical lithography wherein light is used to transfer a geometric pattern from a photo-mask to a light sensitive chemical photoresist on the substrate. Also imprinting can be applied to pattern the mask. Alternatively the mask may be directly applied in the desired pattern, for example by printing.

BRIEF DESCRIPTION OF THE DRAWINGS

These and other aspects are described in more detail with reference to the drawing. Therein:

FIG. 12A shows a top-view corresponding to the area IIA of a semi-finished product obtained after an additional manufacturing step of a method according to the second aspect, FIG. 12B shows a cross-section according to XIIB-XIIB in FIG. 12A, FIG. 12C shows a portion of the surface of the semi-finished product of FIG. 4B in more detail, FIG. 12D shows a portion of the surface of the semi-finished product of FIG. 12B in more detail.

DETAILED DESCRIPTION OF EMBODIMENTS

Figure 5:
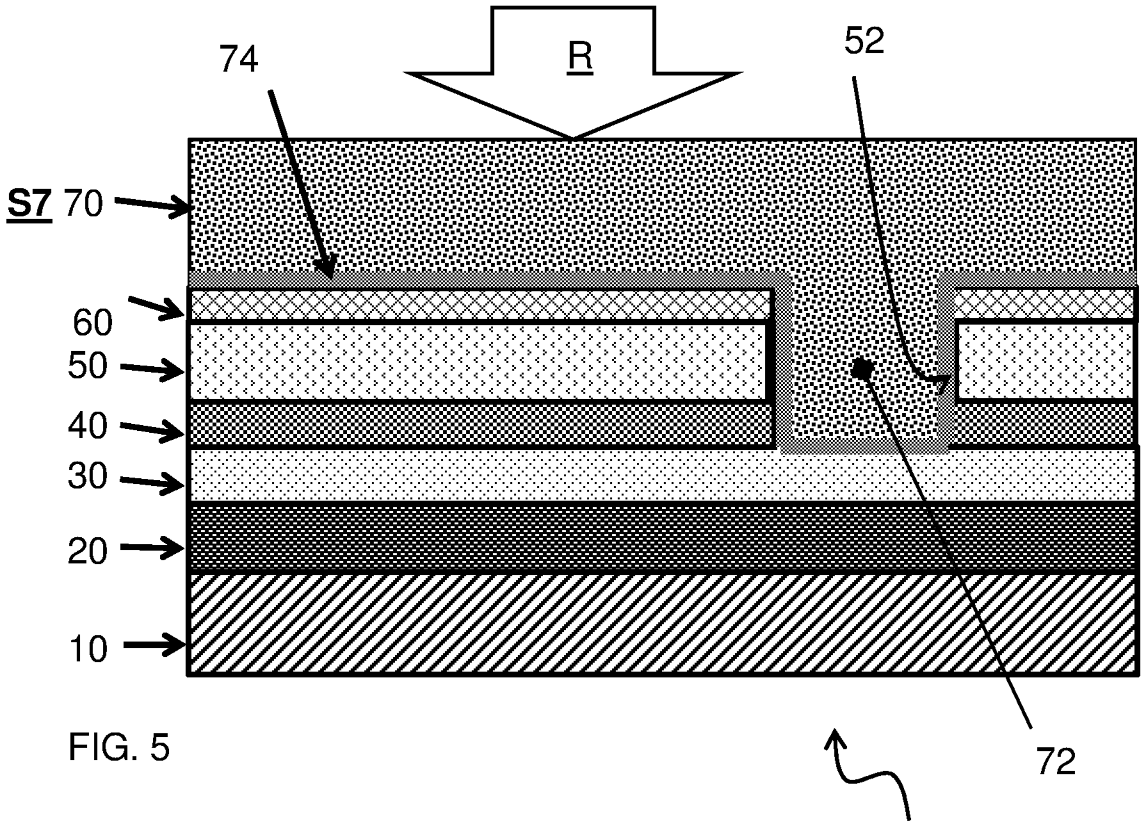
FIG. 5 shows in the same cross-section a first embodiment of a photo-voltaic element according to the first aspect obtained after a further manufacturing step of a method according to the second aspect.

FIG. 5 schematically shows a photo-voltaic element 1. The photo-voltaic element 1 comprises a substrate 10 and a stack of layers arranged thereon. The substrate 10 may be formed of a rigid material such as a metal (e.g. steel, copper or aluminum), silicon or glass or of a flexible material such as a polymer, e.g. a polymer like polyethylene terephthalate (PET), polyethylene naphthalate (PEN), or polyimide (PI). Also thin metal or glass are suitable substrates. If the substrate is conducting, an isolating layer may be deposited on that substrate to isolate the electrode from the substrate. Dependent on the application a thickness of the substrate may be selected in the range of a relatively small value e.g. 50 micron and a relatively large value, e.g. a few mm or more. The stack of layers subsequently includes at least a first electrode layer 20, a first charge carrier transport layer 30, an insulating layer 40, a second electrode layer 50, a second charge carrier transport layer 60, and a photo-electric conversion layer 70.

The first electrode layer 20 is provided for receiving charge carriers of a first polarity. In the embodiment shown the first electrode layer 20 is an anode, i.e. arranged for receiving holes as the charge carriers. Dependent on the lateral size of the photo-voltaic element 1 the first electrode layer 20 may for example have a thickness in the range of a few tens to a few hundreds of nanometers or even more. In the embodiment shown the first electrode layer 20 includes an aluminum sub layer having a thickness of 190 nm, which is sandwiched between a pair of nickel layers, each having a thickness of 5 nm. In another example the first electrode layer is of molybdenum. In an embodiment where the substrate is provided of a metal, it may also serve as a first electrode layer 20.

In the embodiment shown the first charge carrier transport layer 30 is a hole transport layer, having a thickness in the range of 10 to 200 nm. In the embodiment shown the hole transport layer is formed by a nickeloxide layer having a thickness of 50 nm. In another example the hole transport layer is formed by a MoSe layer.

An insulating layer 40 is provided of an organic, e.g. a polymer, or inorganic insulating material, such as a metal oxide. Also a stack of materials can be used. Dependent on the material selected for the insulating layer, it may have a thickness in the range of 10 to 200 nm for example, but also a substantially thicker insulating layer may be applied. In the embodiment shown the insulating layer 40 is provided as a SiO2 layer having a thickness of 100 nm.

A second electrode layer 50 for receiving charge carriers of a second polarity opposite to said first polarity is arranged on the insulating layer 40. In this case the second electrode layer 50 is a cathode. Any sufficiently conducting material can be used for this purpose at a thickness depending on the lateral size of the photo-voltaic element 1. Typically the thickness of the second electrode layer 50 is of the same order of magnitude as the thickness of the first electrode layer 20, so that they have approximately the same conductivity and neither of them forms a bottleneck. In the embodiment shown the second electrode layer 50 is an aluminum layer with a thickness of 200 nm. In some embodiments the second electrode layer 50 may have a thickness greater than that of the first electrode layer 20, e.g. 1.5 times a thickness of the first electrode layer 20, to compensate for the presence of the openings provided in the second electrode layer 50.

A second charge carrier transport layer 60 for transport of charge carriers having said the second polarity, opposite to the first polarity layer is arranged upon the second electrode layer 50. In this case the second charge carrier transport layer 60 is an electron transport layer. The second charge carrier transport layer 60, here an electron transport layer may have a thickness in the range of a few nm, e.g. 5 nm to a few tens of nm, e.g. 50 nm. In the embodiment shown the second charge carrier transport layer 60 is a $TiO_2$ layer having thickness of 15 nm. Other suitable materials for an electron transport layer are for example $SnO_2$, $ZrO_2$ and ZnO:S.

A photo-electric conversion layer 70 is provided upon the second charge carrier transport layer 60. The photo-electric conversion layer 70 has a plurality of distributed, typically cylindrical, extensions 72 that extend through the second charge carrier transport layer 60, the second electrode layer 50 and the insulating layer 40 to the first charge carrier transport layer 30. Therewith the photo-electric conversion layer 70 is electrically coupled to both the first charge carrier transport layer 30 and the second charge carrier transport layer 60. In this arrangement solar radiation R does not need to traverse an electrode layer or a charge carrier transport layer which contributes to an efficient operation of the photo-voltaic element 1. In the embodiment shown the extensions 72 have an effective cross-section $D_{eff}$ in the range of 0.5 to 10 micron, and have an average pitch in the range of 1.1 to 5 times their effective cross-section. The effective cross-section is defined here as the diameter of a circle having an area corresponding to the cross-sectional area $A_{\varnothing}$ of the extensions.

I.e.

$$D_{eff} = \sqrt{\frac{4A_{\Phi}}{\pi}}$$

The extensions may have any cross-section, such as circular, square or triangular. Preferably, a circumference O of the extensions is less than 10 times the effective diameter $D_{eff}$ and even more preferably less than 5 times the effective diameter $D_{eff}$.

In the embodiment the photo-electric conversion layer is provided of a perovskite material, such as methylammonium lead trihalide ($CH_3NH_3PbX_3$), or cesium-formamidinum lead trihalide ($Cs_{0.05}(H_2NCHNH_2)_{0.95}PbI_{2.85}Br_{0.15}$). Alternatively a tin based perovskite material, such as $CH_3NH_3SnI_3$ may be used. Also more complex perovskite materials may be applied, for example containing a combination of different cations. Also other materials, such as copper indium gallium selenide (CIGS) are suitable.

In the embodiment shown the second electrode layer 50 has anodized edge surfaces 52 facing the extensions 72 of the photo-electric conversion layer 70. This avoids direct contact between the second electrode layer and the photo-electric conversion layer.

Figure 4A:
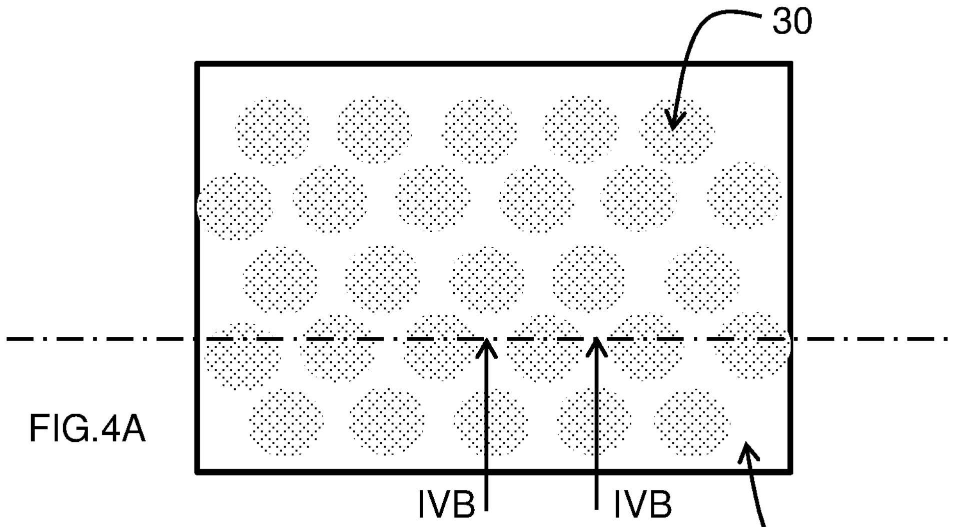
FIG. 4A shows a top-view corresponding to the area IIA of a semi-finished product obtained after a still further additional manufacturing step of a method according to the second aspect.
Figure 4B:
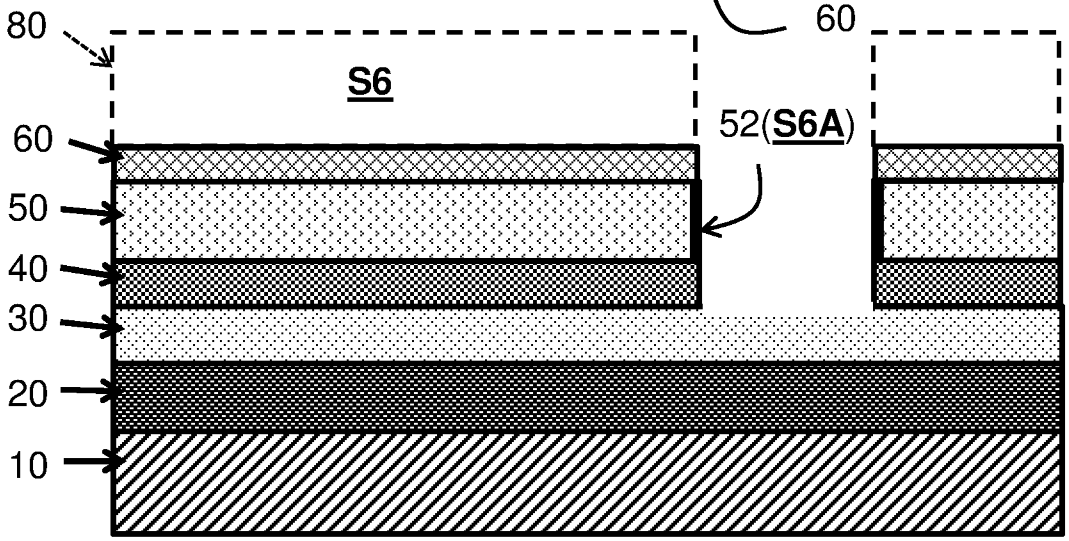
FIG. 4B shows a cross-section according to IVB-IVB in FIG. 4A.
Figure 4C:
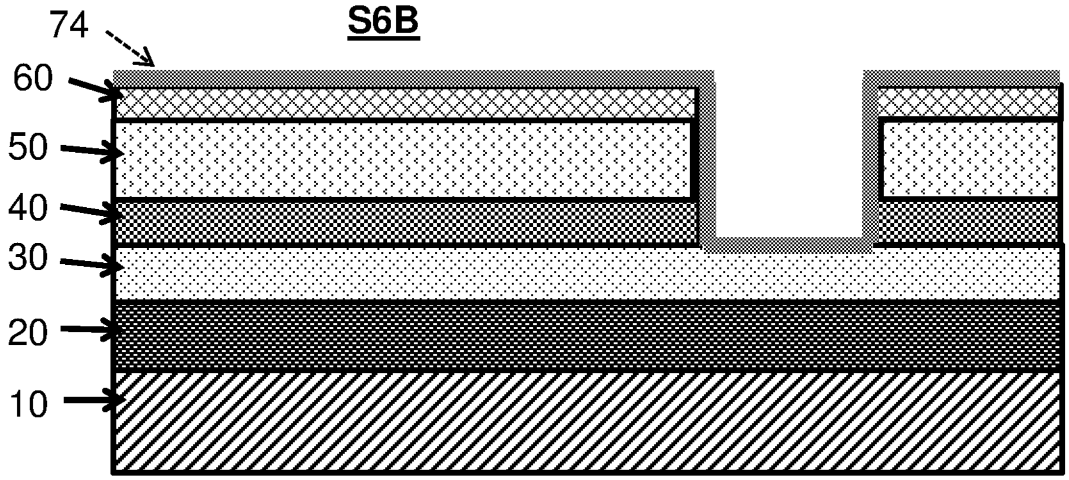
FIG. 4C shows in the same cross-section an optional manufacturing step of a method according to the second aspect.
Figure 4D:
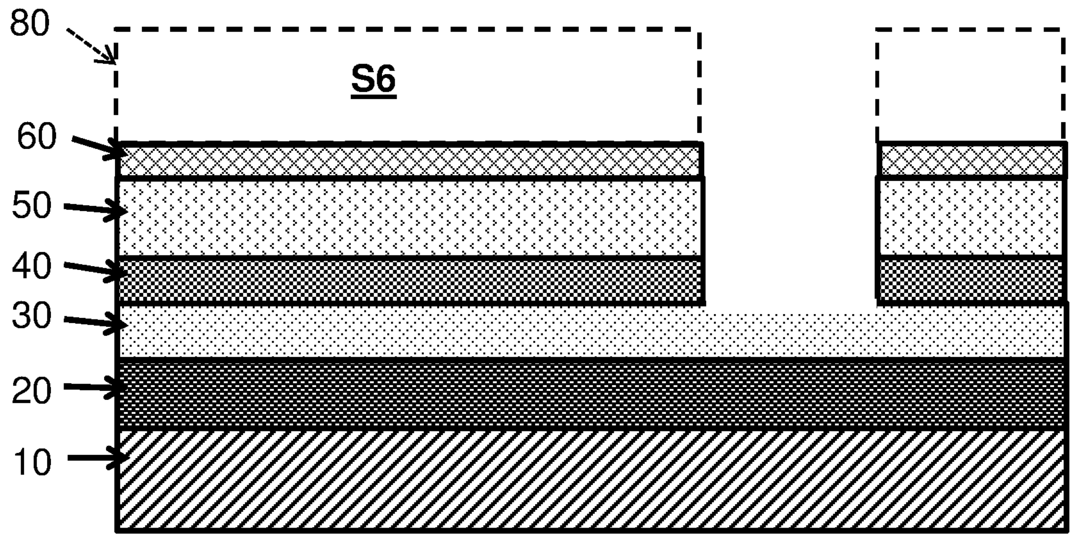
FIG. 4D shows in the same cross-section an alternative optional manufacturing step of a method according to the second aspect.
Figure 4E:
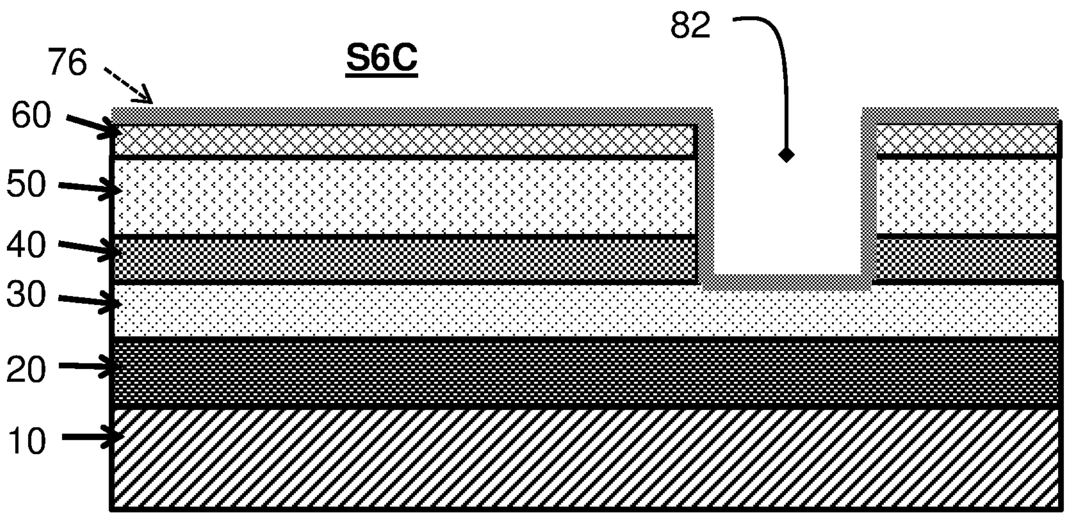
FIG. 4E shows in the same cross-section a subsequent alternative optional manufacturing step of a method according to the second aspect.
Figure 4F:
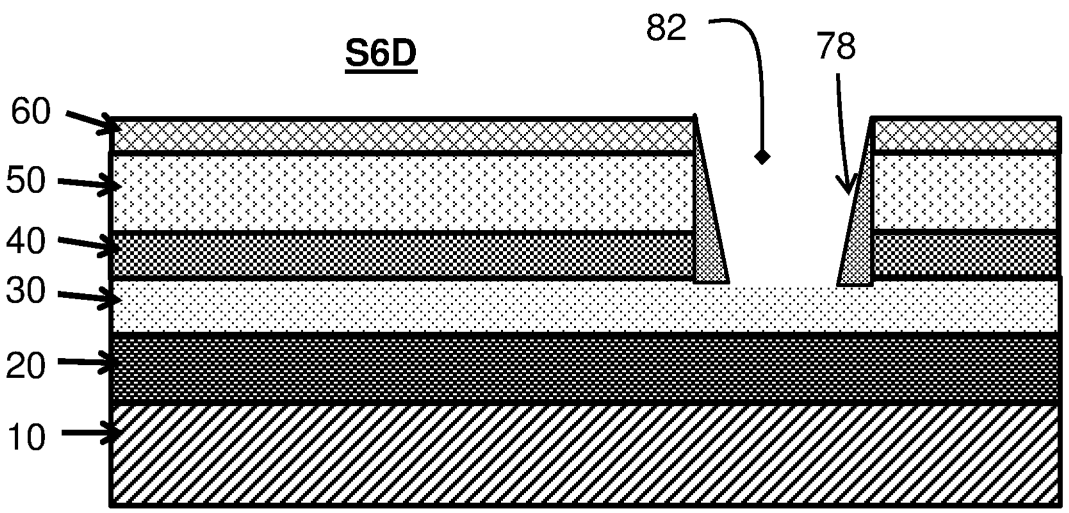
FIG. 4F shows in the same cross-section a further subsequent alternative optional manufacturing step of a method according to the second aspect.
Figure 4G:
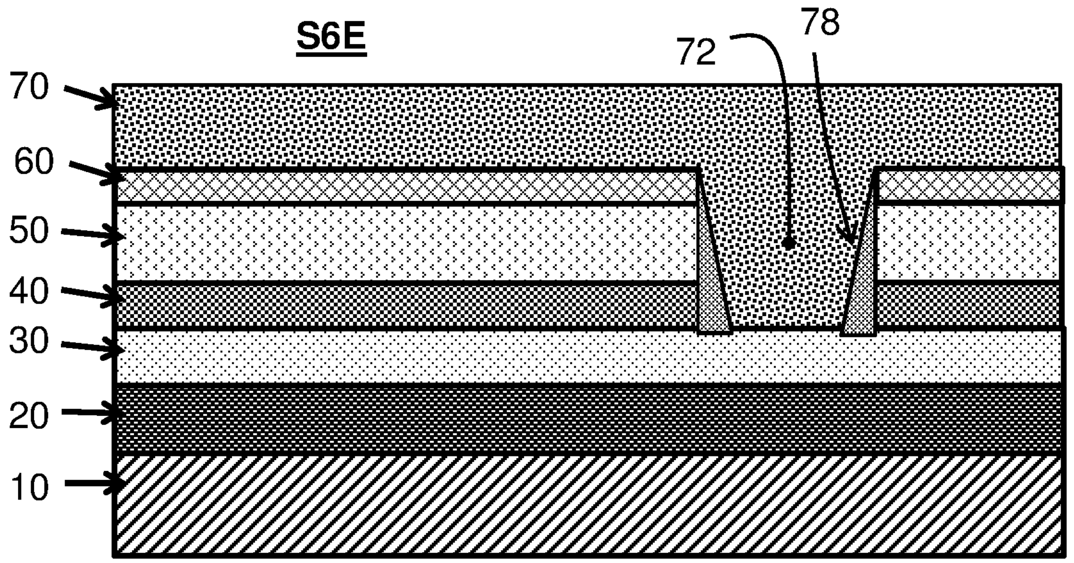
FIG. 4G shows in the same cross-section an alternative embodiment resulting from a still further subsequent alternative optional manufacturing step following the step illustrated in FIG. 4F.

FIG. 4G illustrates an alternative embodiment wherein such direct contact is avoided. Therein the openings 82 are provided with an insulating wall 78, e.g. of a ceramic material. The specific steps for manufacturing this embodiment are described in more detail below with reference to FIG. 4D to FIG. 4G.

Figure 6:
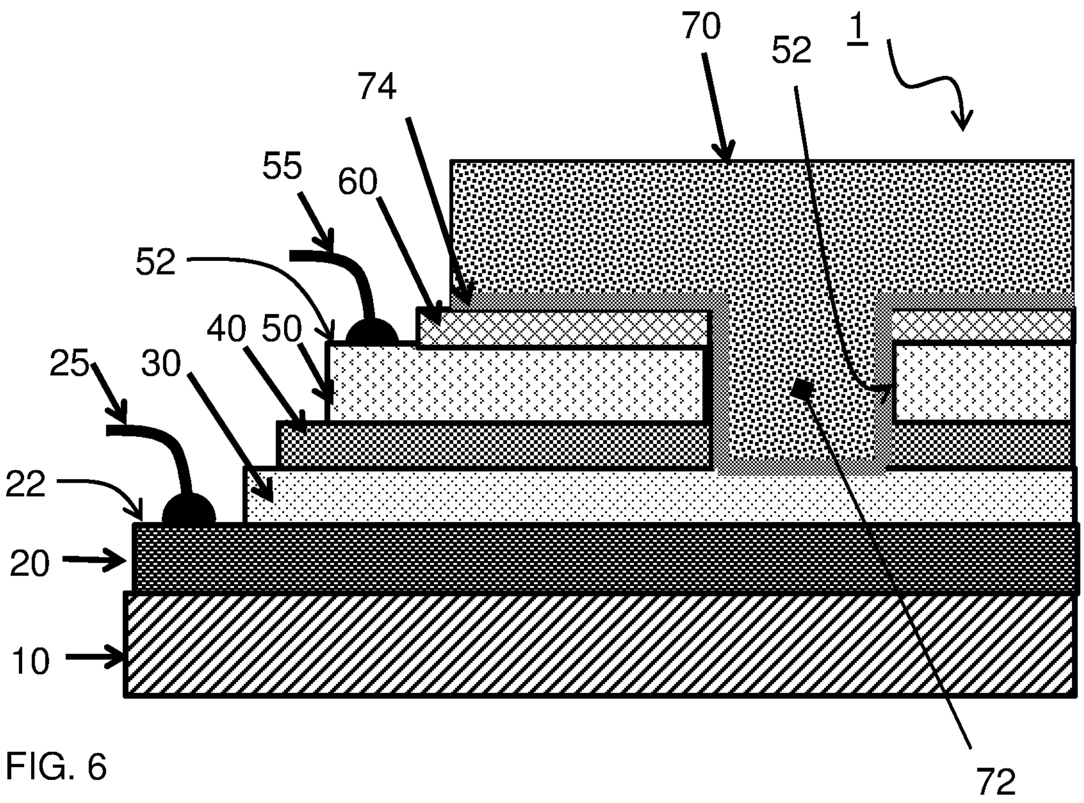
FIG. 6 shows in the same cross-section a second embodiment of a photo-voltaic element according to the first aspect.

FIG. 6 shows an embodiment of the photo-voltaic element 1 of the invention wherein an edge portion 22 of an upper surface of the first electrode layer 20 is kept free from material of the first charge carrier transport layer 30 and is provided with a first electrical contact 25. Also an edge portion 52 of an upper surface of the second electrode layer 50 is kept free from material of the second charge carrier transport layer 60 and is provided with a second electrical contact 55. Another possibility is to remove the carrier transport layer 30 and isolator 40 with e.g. laser ablation before deposition of electrode 50, so a contact can be made from electrode 50 to electrode 20. Also before deposition of charge carrier transport layer 30 a laser step could be used to interrupt the electrode 20.

Figure 8A:
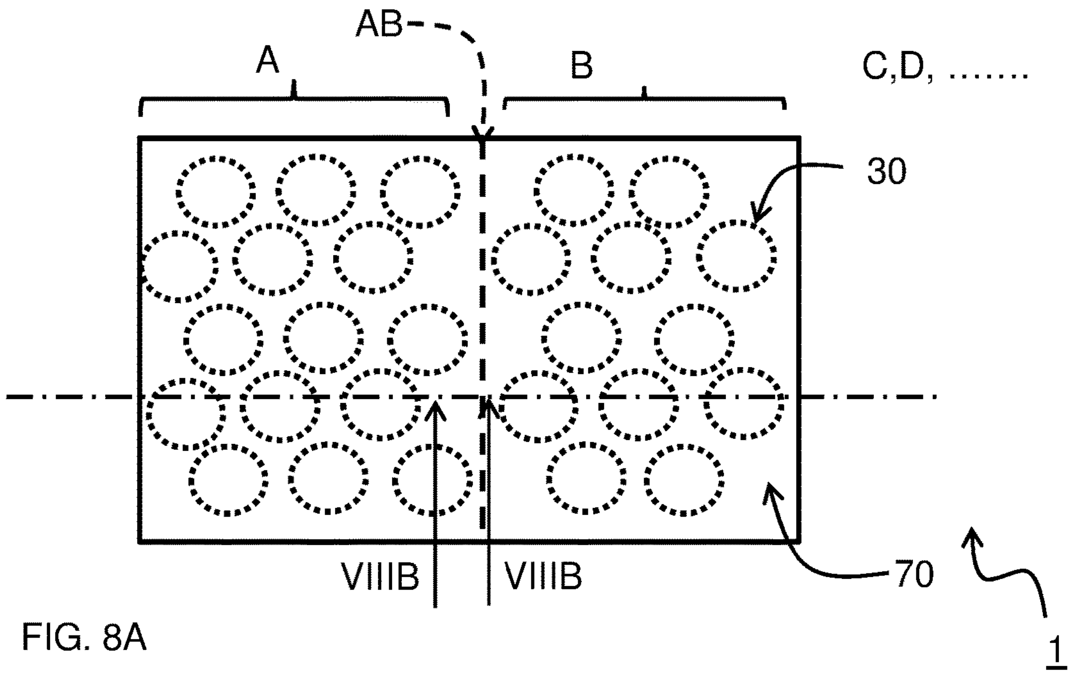
FIG. 8A shows a top-view corresponding to the area IIA of a fourth embodiment of a photo-voltaic element according to the first aspect.
Figure 8B:
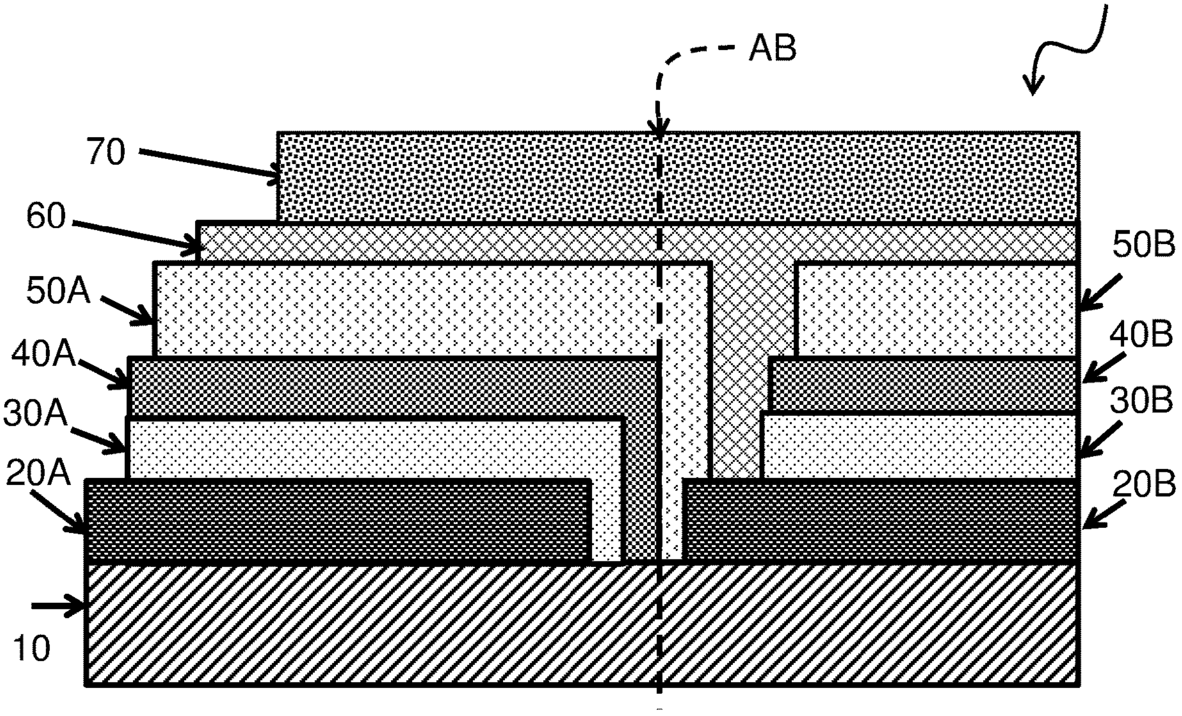
FIG. 8B shows a cross-section according to VIIIB-VIIIB in FIG. 8A.

FIGS. 8A and 8B show a further embodiment of a photo-voltaic element according to the invention. Therein FIG. 8A shows a top-view and FIG. 8B shows a cross-section of a portion of the device according to VIIIB-VIIIB in FIG. 8A. In this further embodiment the first electrode layer 20, the first charge carrier transport layer 30, the insulating layer 40 and the second electrode layer 50 are provided as a plurality of layer segments. Therein a plurality of lateral sub-stack segments is formed. By way of example two lateral sub-stack segments A, B are shown in this case. However in practice the photo-voltaic element may have a larger number of lateral sub-stack segments C, D, . . . e.g. 10 or 100 or more, depending on a required lateral size of the photo-voltaic element.

As shown in FIG. 8B each layer segment A, B comprises a first electrode layer segment 20A, 20B, a first charge carrier transport layer segment 30A, 30B, an insulating layer segment 40A, 40B and a second electrode layer segment 50A, 50B. The second charge carrier transport layer 60 and the photo-electric conversion layer 70 are formed as continuous layers. A second electrode layer segment 50A of a lateral sub-stack segment A extends over a first electrode layer segment (20B) in a neighboring sub-stack segment B. Therewith an electrical connection is formed between the second electrode layer segment 50A of the lateral sub-stack segment A and the first electrode layer segment 20B in the neighboring lateral sub-stack segment. In this way the photo-voltaic element is formed as a plurality of serially connected modules, which makes it possible to reduce resistive losses as compared to a photo-voltaic element that is not partitioned into serially connected modules. It could alternatively be contemplated to serially arrange a plurality of smaller photo-voltaic elements. It is however an advantage of the embodiment of FIG. 8A, 8B that external connection elements are avoided. A photo-voltaic element as shown in FIG. 8A, 8B could for example be provided as a single elongate product applied on a foil, e.g. delivered in a length of tens to hundreds of meters on a roll.

Figure 7:
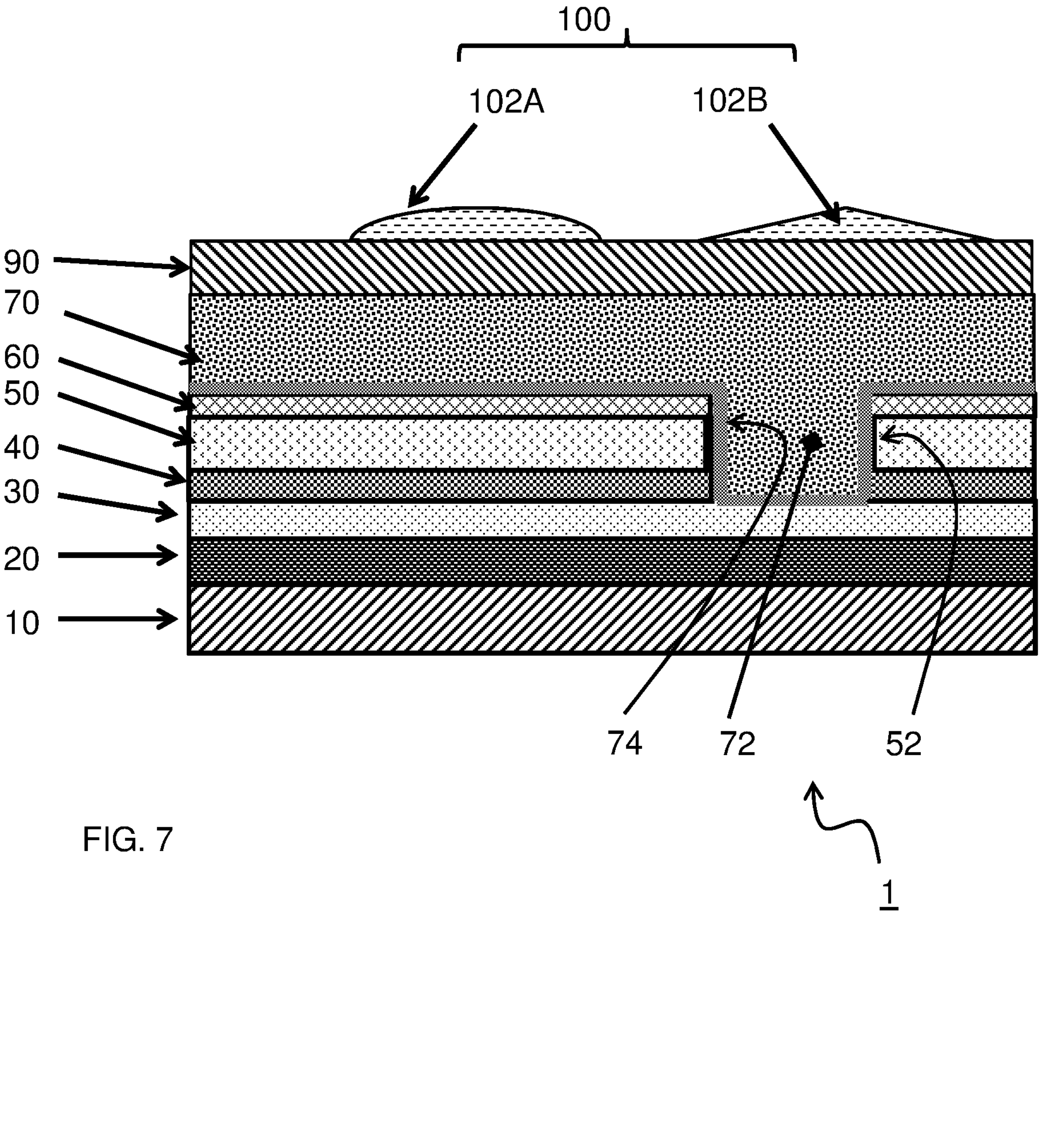
FIG. 7 shows in the same cross-section a third embodiment of a photo-voltaic element according to the first aspect.

As shown in FIG. 7 additional layers may be provided. In the embodiment of FIG. 7 for example a barrier 90 is arranged over said photo-electric conversion layer 70. Suitable materials for the barrier are metal oxides, such as SiOx and SiNx. In practice the barrier 90 may comprise a plurality of layers, such as a stack of inorganic layers having a mutually different composition. Also a combination of inorganic layers and organic layers may be used. For example a barrier 90 may be formed by a first and a second inorganic layer that sandwich an organic layer. For a good light in coupling it is preferred that the materials used for the barrier 90 have a refractive index lower than that of the photo-electric conversion layer 70.

In the embodiment shown light in coupling is further improved by a light in coupling structure 100 arranged over the barrier 90. In the embodiment shown the light in coupling structure comprises a plurality of light in coupling elements 102A, 102B. For example semi-spherical or pyramidal shaped light in coupling elements may be used.

A method of manufacturing a photo-voltaic element is now disclosed with reference to FIG. 1 to 5.

Figure 1A:
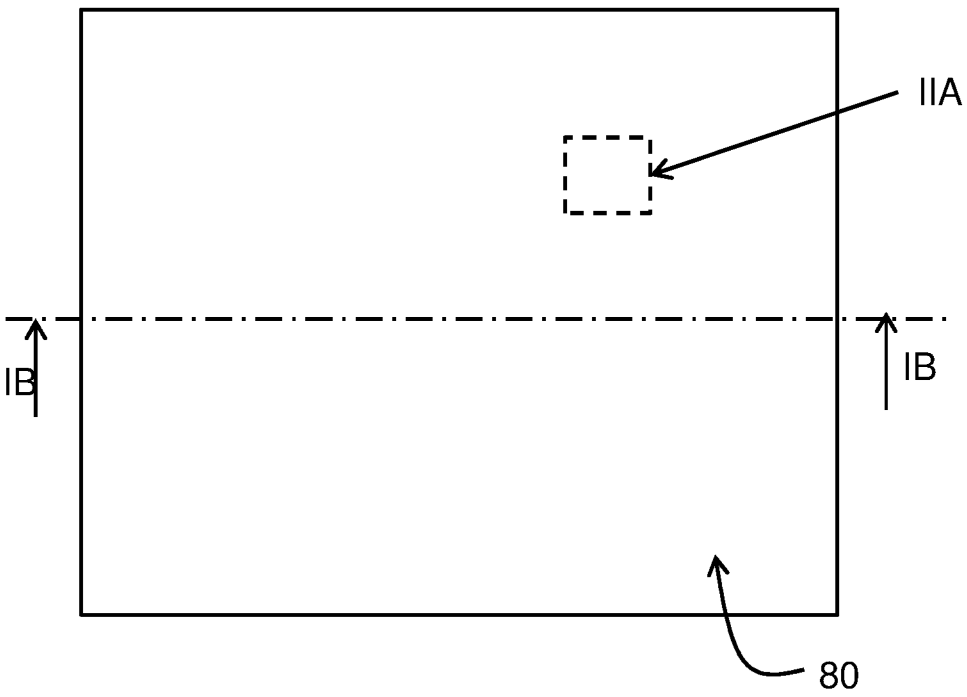
FIG. 1A schematically shows a top-view of a semi-finished product obtained during performing a method according to the second aspect.
Figure 1B:
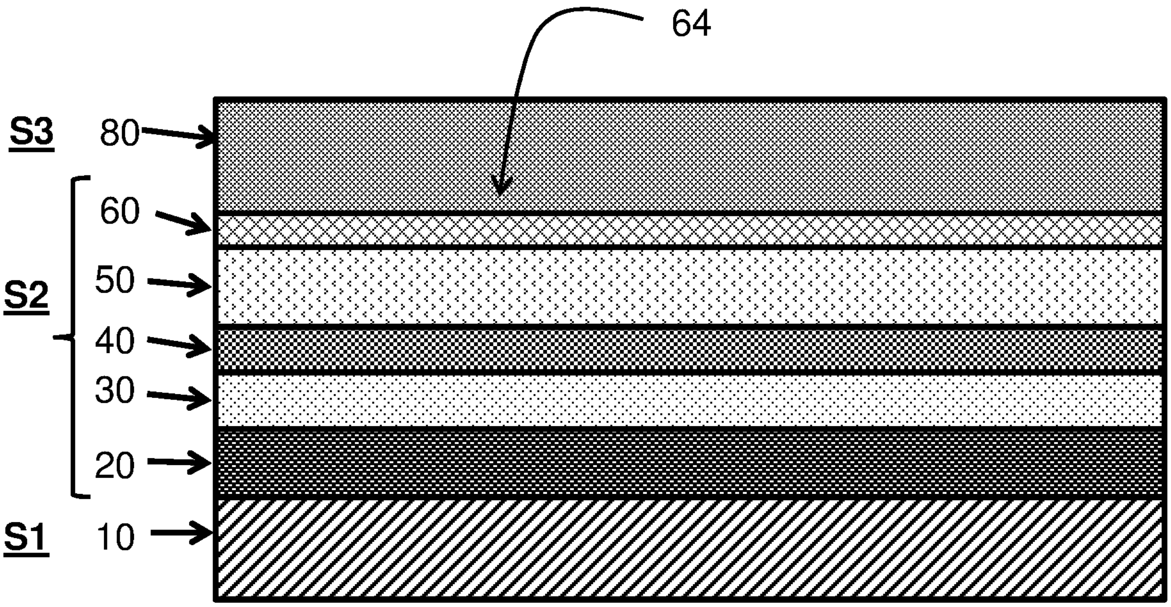
FIG. 1B shows a cross-section according to IB-IB in FIG. 1A.

FIG. 1A, 1B show the intermediate product obtained after a first three steps. Therein FIG. 1A shows a top-view and FIG. 1B shows a cross-section according to IB-IB in FIG. 1A.

Therein a substrate is 10 is provided in a first step ST. Then in a second step S2 a stack of layers is deposited thereon that comprise at least in the order named a first electrode layer 20, a first charge carrier transport layer 30, an insulating layer 40, a second electrode layer 50 and a second charge carrier transport layer.

The first electrode layer 20 is provided for receiving charge carriers of a first polarity. The first electrode layer 20 may for example be an anode, i.e. arranged for receiving holes as the charge carriers. Alternatively the first electrode layer 20 may be a cathode, i.e. arranged for receiving electrons as the charge carriers. In an embodiment the first electrode layer 20 is deposited with a PVD (physical vapor deposition) method, for example using E-beam PVD. In this example the first electrode layer 20 was provided as a stack of sub-layers obtained by subsequently depositing a first sub-layer of nickel having a thickness of 5 nm, an aluminum layer having a thickness of 190 nm and a second sub-layer of nickel also having a thickness of 5 nm. Then spin-coating (1000 rpm) was used to deposit a NiO layer as the first charge carrier transport layer 30, here a hole transport layer.

An insulating layer 40 was then deposited in a first and a second stage. In the first of these stages a first, 100 nm thick, sublayer of SiOx was deposited by electron-beam deposition and in the second stage a second sublayer of SiOx, also having a thickness of 100 nm was deposited by PECVD. Then a second electrode layer 50, here a cathode layer of aluminum at a thickness of 200 nm was formed using the same method and conditions as those applied for the deposition of the aluminum sub-layer of the first electrode layer 20.

A second charge carrier transport layer 60, here an electron transport layer was then deposited. In this case electron-beam vapor deposition was used to deposit a $TiO_x$ layer with a thickness of 15 nm of linear titanium dioxide (TiOx).

The insulating layer 40 and the layers 50, 60 form a sub-stack having an upper surface 64. In a third step S3, here using spin coating a resist layer 80, here a photo-resist layer having a thickness of 1.6 micron was deposited on this upper surface 64. In other implementations the resist layer may be an imprint-resist layer.

Figure 2A:
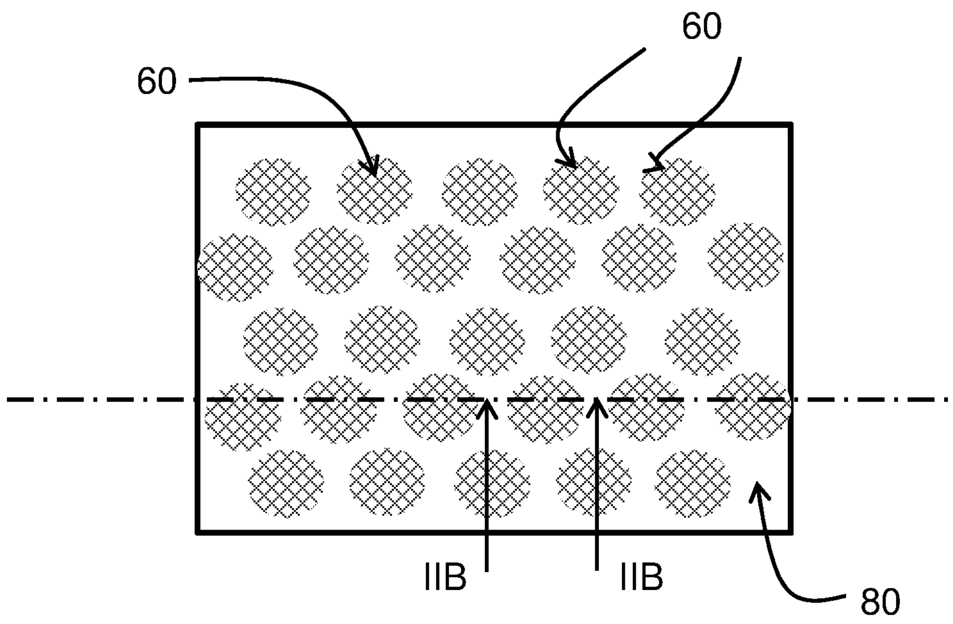
FIG. 2A shows a top-view corresponding to the area IIA of a semi-finished product obtained after an additional manufacturing step of a method according to the second aspect.
Figure 2B:
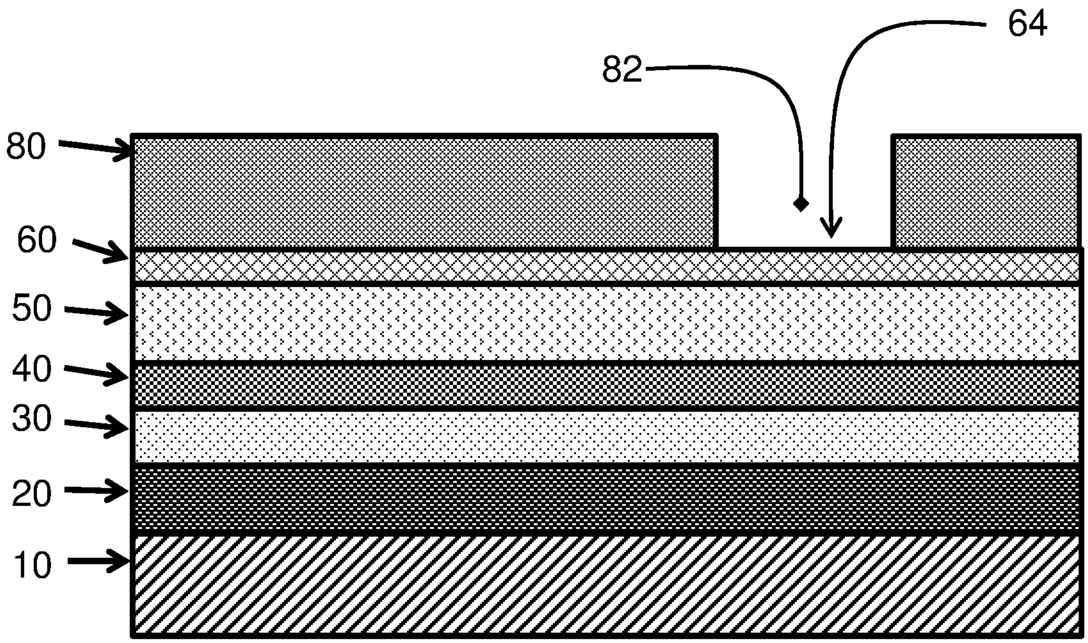
FIG. 2B shows a cross-section according to IIB-IIB in FIG. 2A.

FIG. 2A, 2B show a subsequent step S4. Therein FIG. 2A shows a top-view of an intermediate product resulting from this step S4 and FIG. 2B shows a cross-section according to IIB-IIB in FIG. 2A. In this subsequent step regularly distributed openings 82 giving access to the upper surface 64 are formed in the resist layer 80. In this embodiment contact lithography was used for this purpose. Using the method described herewith samples were prepared having openings with diameter in the range of 0.5-5 μm and a distance between neighboring openings in the range of 1-5 μm. Therewith a pitch between 1 and 10 μm is obtained. The openings having an effective cross-section D in the range of 0.5 to 10 micron, and have an average pitch in the range of 1.1 to 5 times the effective cross-section.

Instead of patterning an originally homogeneous resist layer, it is alternatively possible to directly depositing the resist layer in the desired pattern, for example using a printing technique.

Figure 3A:
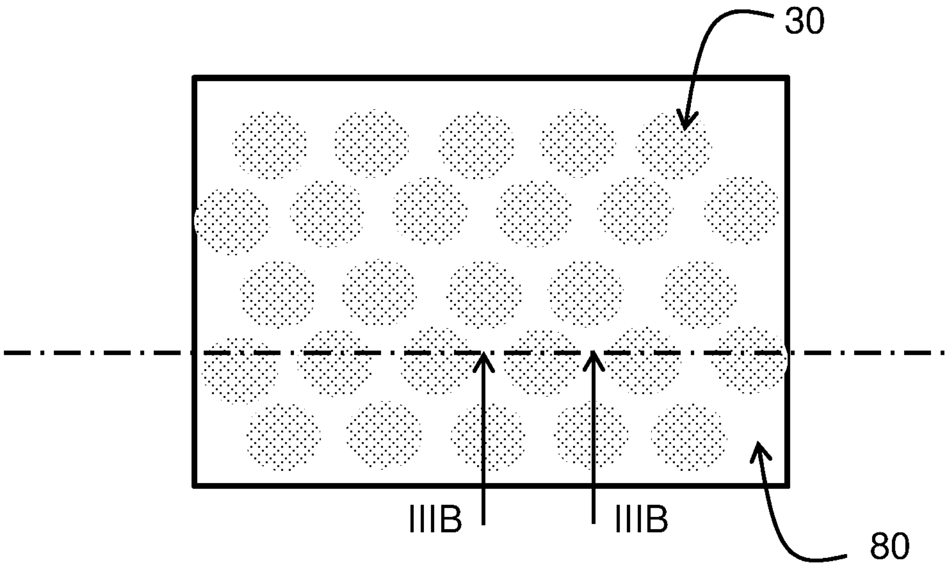
FIG. 3A shows a top-view corresponding to the area IIA of a semi-finished product obtained after a further additional manufacturing step of a method according to the second aspect.
Figure 3B:
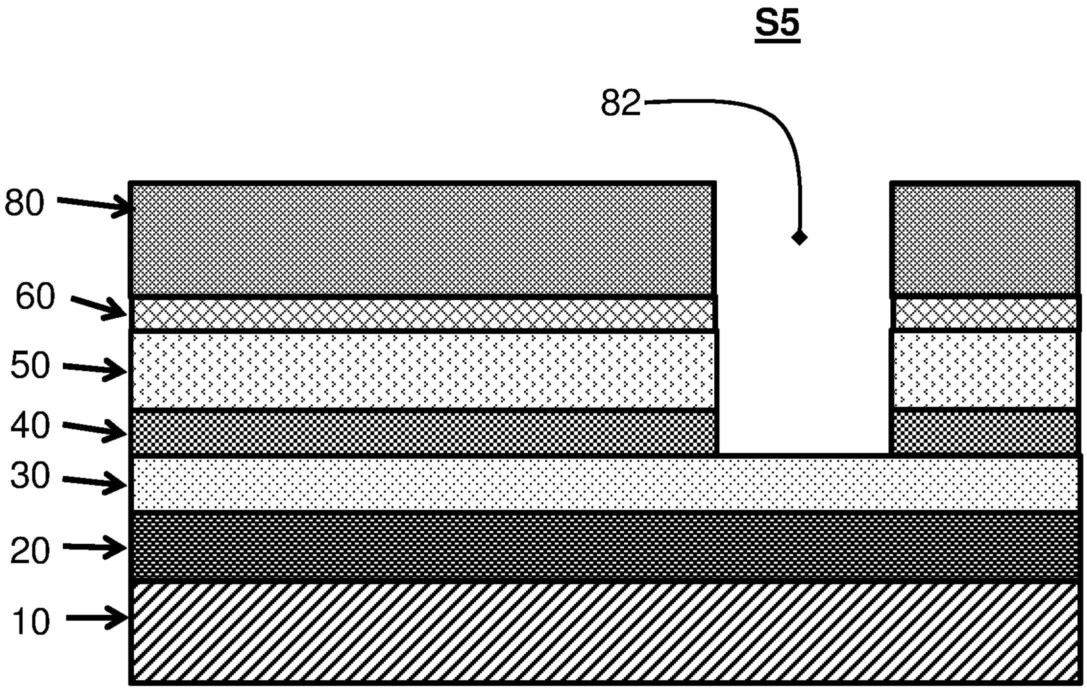
FIG. 3B shows a cross-section according to IIIB-IIIB in FIG. 3A.

FIGS. 3A and 3B show a subsequent step S5, wherein material of the sub-stack 40, 50, 60 facing the openings 82 is selectively removed. Therein FIG. 3A shows a top-view of the semi-finished product obtained after this step S5 and FIG. 3B shows a cross-section according to IIIB-IIIB in FIG. 3A. Step S5 involves etching the upper layers 50, 60 by plasma etching. Then the insulating $SiO_x$ layer is etched with a further plasma etching process. The photo-resist layer 80 is then fully removed (Step S6), for example by oxygen plasma-etching as illustrated in FIGS. 4A and 4B. Therein FIG. 4A is a top-view and FIG. 4B shows a cross-section according to IVB-IVB in FIG. 4A.

As shown in FIG. 5, in a step S7, subsequent to this step S6, a photo-electric conversion layer 70 is deposited (for example by spin-coating) and cured.

Optional pre-processing steps, S6A and S6B may be performed after removal of the resist layer 80 and before deposition of the photo-electric conversion layer 70.

A first optional pre-processing step S6A is illustrated in FIG. 4B. Therein an edge surface 52 of the second electrode layer 50 is anodized. This edge surface 52 was formed by the step of etching S5. In the anodization process an insulating layer is formed on the edge surface 52 therewith avoiding a direct contact between the second electrode layer 50 and the photo-electric conversion layer 70.

FIG. 4C illustrates a second optional pre-processing step S6B. Therein to facilitate the deposition in step S7, an atomic layer deposition process (ALD) may be used to deposit a thin growth layer 74, e.g. applying a $TiO_2$ layer with a few sALD cycles.

FIG. 4D-4G shows an alternative approach for preventing a direct electrical contact between the second electrode layer 50 and the photo-electric conversion layer 70. After removal (S6) of the patterned resist layer 80 as shown in FIG. 4D, a layer 76 of an insulating material is conformally deposited (Step S6C) on the semi-finished product of FIG. 4D, therewith obtaining the semifinished product of FIG. 4E. Then an anisotropic etch step S6D, e.g. a plasma etch step is applied. The anisotropic etch step S6D removes the insulating material from the surface of the second charge carrier transport layer 60 and from the surface portions of the first charge carrier transport layer 30 within the openings 82 but keeps a layer of the insulating material on the walls of the openings 82 intact. Subsequent to this step S6D the photo-electric conversion layer can be deposited (S6E) as shown in FIG. 4G.

Upon completion the substrate 10 may be removed. For example this may be the case if an electrode layer, e.g. the first electrode layer 20 provides sufficient structural integrity. Alternatively, or in addition mechanical support may be provided by further layers applied on the photo-electric conversion layer 70.

FIGS. 9A, 9B, 10A, 10B, 11A, 11B, 12A, 12B and 13 show a further alternative embodiment of a method of manufacturing.

Figure 9A:
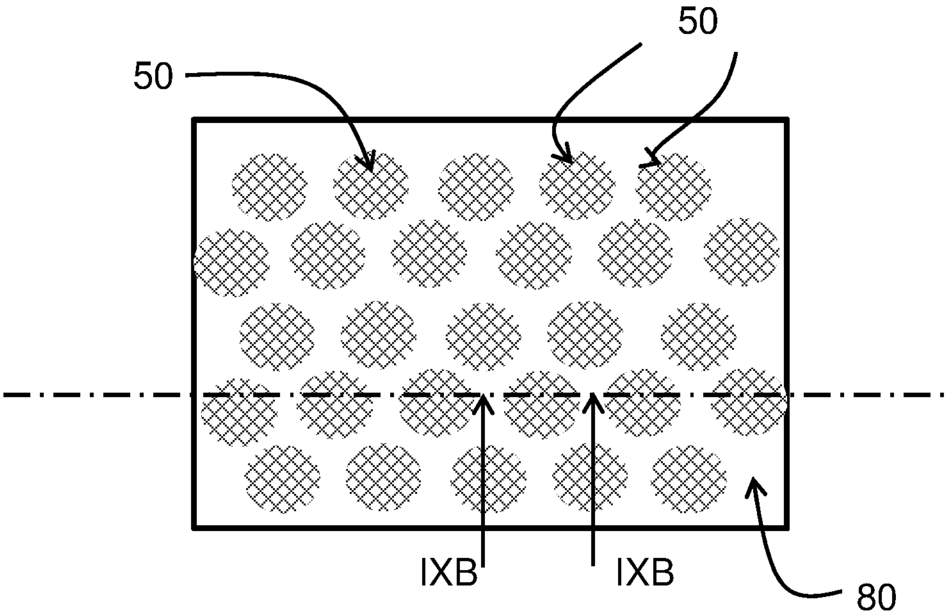
FIG. 9A shows a top-view corresponding to the area IIA of a semi-finished product obtained after an additional manufacturing step of a method according to the second aspect.
Figure 9B:
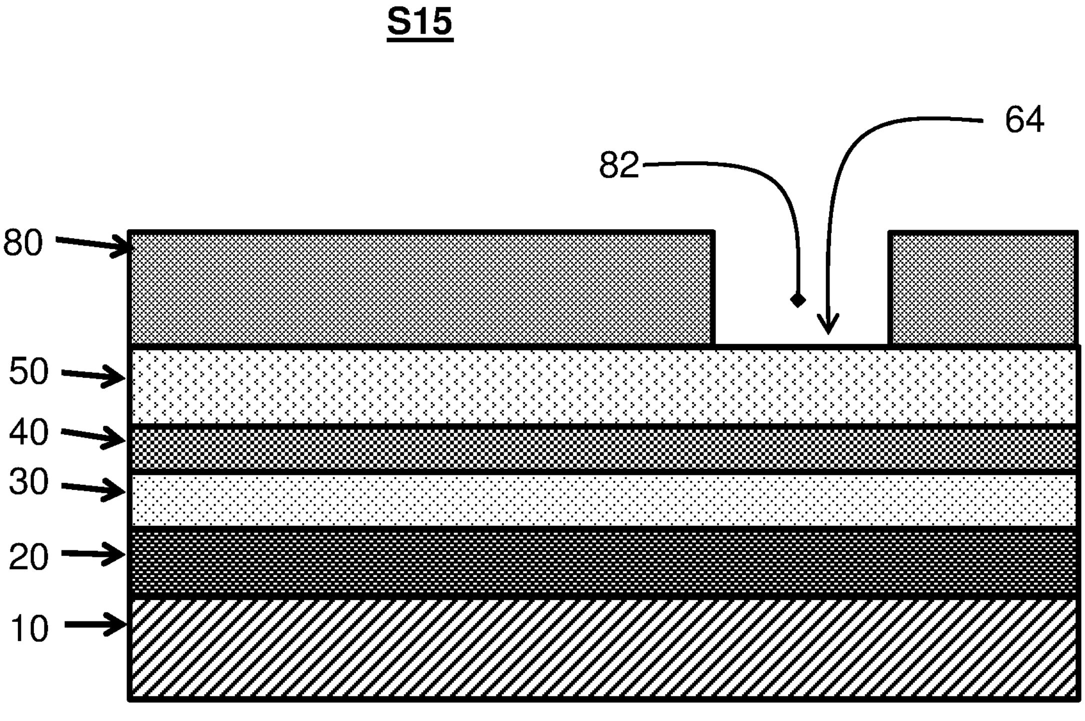
FIG. 9B shows a cross-section according to IXB-IXB in FIG. 9A.
Figure 10A:
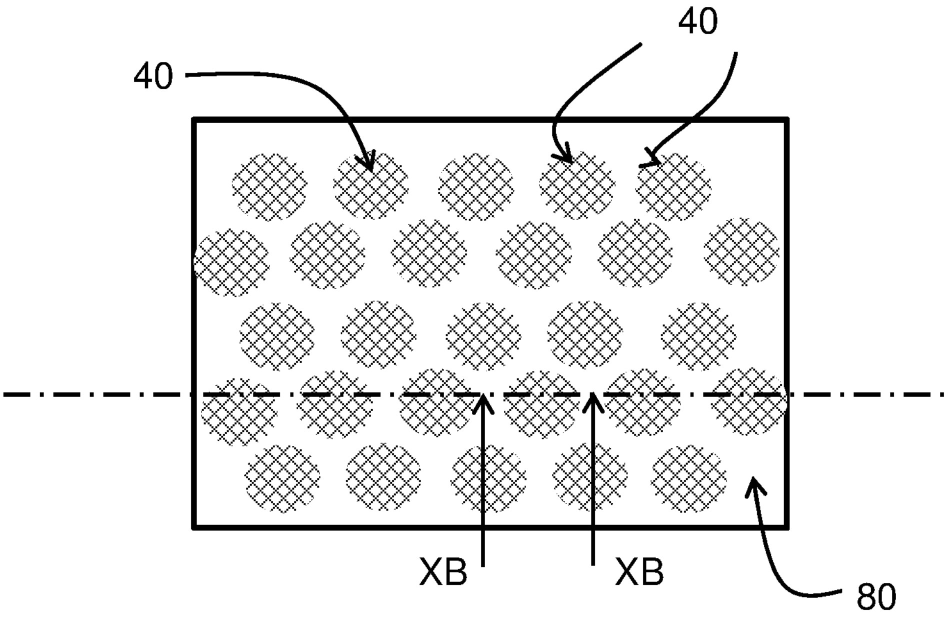
FIG. 10A shows a top-view corresponding to the area IIA of a semi-finished product obtained after an additional manufacturing step of a method according to the second aspect.
Figure 10B:
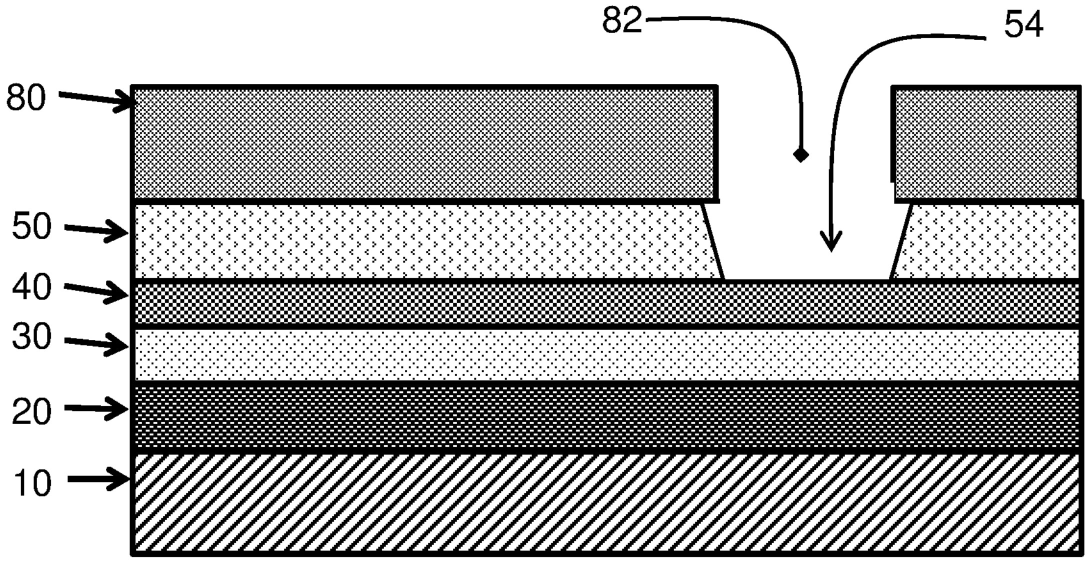
FIG. 10B shows a cross-section according to XB-XB in FIG. 10A.

Therein FIG. 9A, 9B show a semi-finished product that is obtained after step S15 of this embodiment. The steps of this embodiment up to and including S15 of this embodiment correspond to those disclosed herein for steps S1-S5 of the embodiment of FIGS. 1A, 1B, 2A, 2B and 3A, 3B, except for the fact that the step corresponding to step S2, does not include deposition of a charge carrier transport layer 60. Instead the charge carrier transport layer 60 is deposited in another stage of the process as is discussed with reference to FIG. 12A, 12B. Following step S15, in step S16 shown in FIG. 10A, 10B, an opening 54 is formed in the second electrode layer 50. This can be achieved by a wet etching step selected for the second electrode layer 50. For example using a PES (Phosphoric Acid, Acetic Acid, Sulphoric acid The last is now often replaced with Nitric acid) solution in case of a second electrode 50 formed by an aluminum layer or having an aluminum layer as a main layer which is sandwiched between auxiliary layers, e.g. formed by molybdenum. Alternatively, if the second electrode 50 is formed by conductive oxide layer, such as ITO, an HCl-FeCl solution may be used as the etching agent. Still alternatively an isotropic or anisotropic plasma etching step may be used in step S16A.

Figure 11A:
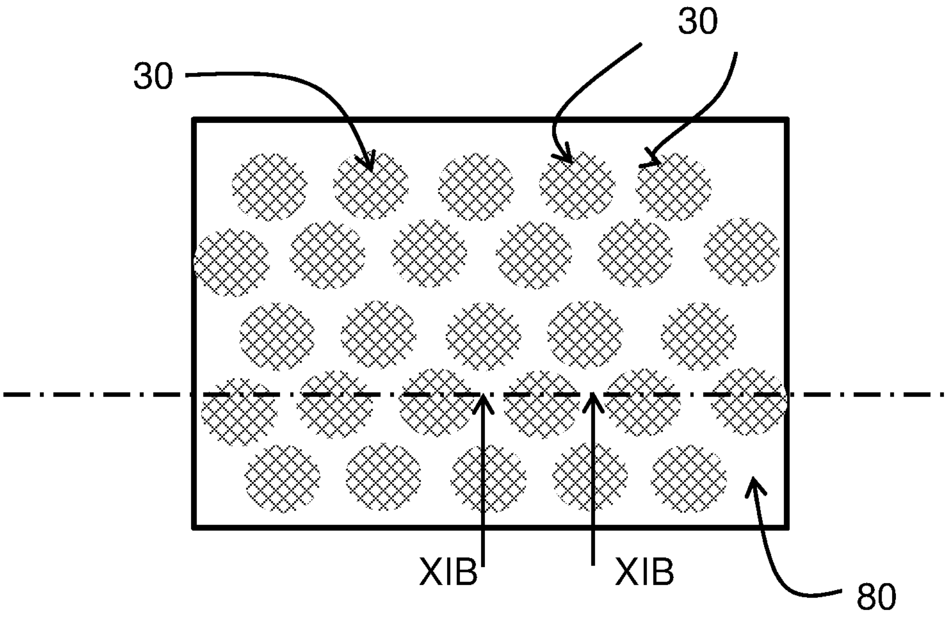
FIG. 11A shows a top-view corresponding to the area IIA of a semi-finished product obtained after an additional manufacturing step of a method according to the second aspect.
Figure 11B:
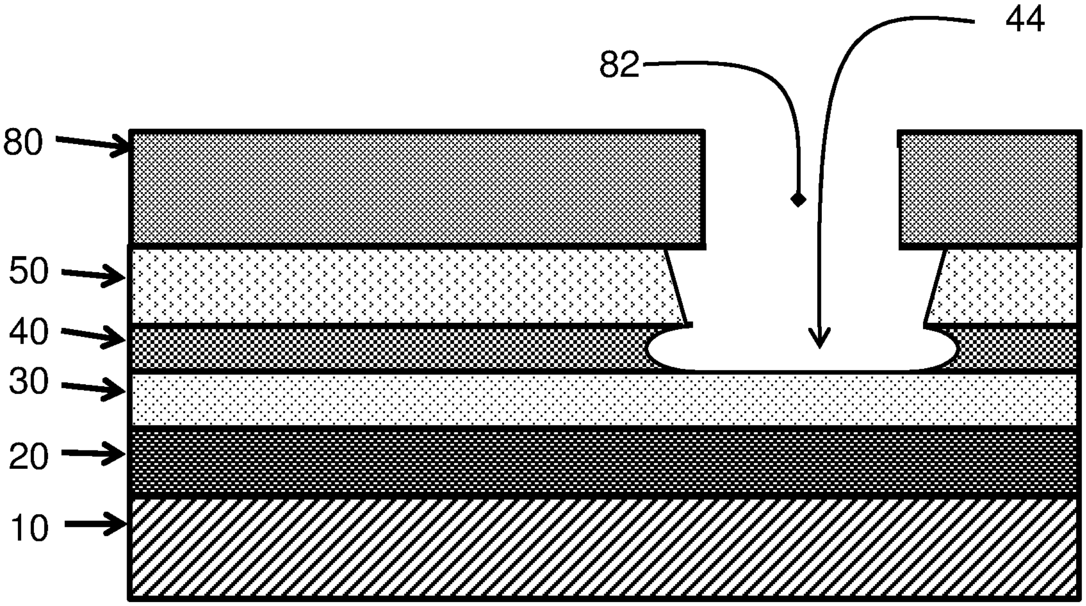
FIG. 11B shows a cross-section according to XIB-XIB in FIG. 11A.

In a next step S16B, as shown in FIG. 11A, 11B, an opening 44 is formed in the insulating layer 40, to expose the surface of the charge carrier transport layer 30. An isotropic plasma etching step, for example using $CF_4/O_2$ may be applied. Also wet etching can be used. E.G. $NH_4F$ if a siliconoxide isolator is used.

In a further step S16C, a second charge carrier transport layer 60, is deposited in an electroplating process, therewith using the layer 50 as the electrode. Due to the curved edge 55 of the opening formed in the electrode 50, an increased electric field is obtained that enhances the deposition speed near the opening. By way of example, a hole transport layer may be deposited as the charge carrier transport layer 60, e.g. CuSCN using a solution of $CuSO_4$/Nitrilotriacetic acid/KSCN. Alternatively, the charge carrier transport layer 60 may be deposited from an ionic liquid.

Then in step S17, which is comparable to step S7 as disclosed with reference to FIG. 5, a photo-electric conversion layer 70 is deposited.

In the photo-voltaic element so obtained, the extensions 72 taper outward in a direction from the first charge carrier transport layer 30 towards the second charge carrier layer 60. As a result of the electroplating process used for the second charge carrier transport layer 60, the material thereof covers a surface of the second electrode 50 surrounding the extensions 72. Using an isotropic etching process, the openings formed will taper outward towards the second charge carrier layer 60 with an angle of approximately 45 degrees, so that the perimeter of the opening at the contact-surface of the first charge carrier transport layer is displaced with respect to the perimeter at the level of the surface of the second charge carrier transport layer is of the order of magnitude of the total thickness of the layers in which the opening is formed. For example, if the effective cross-section Deff of the opening with which the first charge carrier layer 30 is to be exposed, as defined by the mask used for etching is 1 micron, and the thicknesses of the second electrode layer 50 and the insulating layer 40 are 100 nm and 300 nm respectively, then at the plane surface of the second charge carrier transport layer 60, the cross-section Dout may be about 1.8 micron. As the electroplated second charge carrier layer 60 also has a portion 65 that extends over the tapering wall of the opening the contact surface of the second charge carrier layer 60 available for the photovoltaic layer 70 to be deposited in the next step is increased as compared to the situation in FIG. 4B for example. In the embodiment of FIG. 12B, the available contact surface At formed by the tapering hole in the second charge carrier transport layer is $At=\pi H(D_{eff}+\alpha H)$, wherein H is the height of the electrode layer 50 and $\alpha$ is the inclination factor with which the diameter widens towards the surface 67 of the second charge carrier transport layer 60. I.e. the inclination factor $\alpha$ is defined by $$\alpha=(D\text{out}-D\text{eff})/2H.$$

This additional surface At is illustrated as the hatched are At in FIG. 12D

This is compared with the situation in FIG. 4B. In that case, an annulus having an inner diameter Deff and an outer diameter Dout would be additionally available at the surface 67 of the second charge carrier transport layer. The surface Ac of this area between the dashed circle in FIG. 12C and area removed by the opening to give access to the first charge carrier transport layer 30 is equal to $$Ac=\tfrac{1}{2}\pi\alpha DH+\pi\alpha^2H^2$$

Hence the difference in the surface At and the surface Ac is equal to $$\Delta A=At-Ac=\pi(1-\alpha/2)DH+\pi\alpha(1-\alpha)H^2$$

Accordingly, if $\alpha$ is in a range between 0 and 1, the contact surface area of the second charge carrier layer 60 is always improved. Furthermore an improvement may be obtained in the range $1<\alpha<2$, provided that:

$\pi(1-\alpha/2)D>\pi\alpha(1-\alpha)H$. It is noted that the height of the second charge carrier transport layer 60 typically is substantially smaller than the height of the second electrode layer. However, for visibility the height of this layer 60 is exaggerated.

An alternative embodiment of the method is illustrated in FIG. 14A, 14B, 15A, 16B.

Figure 13:
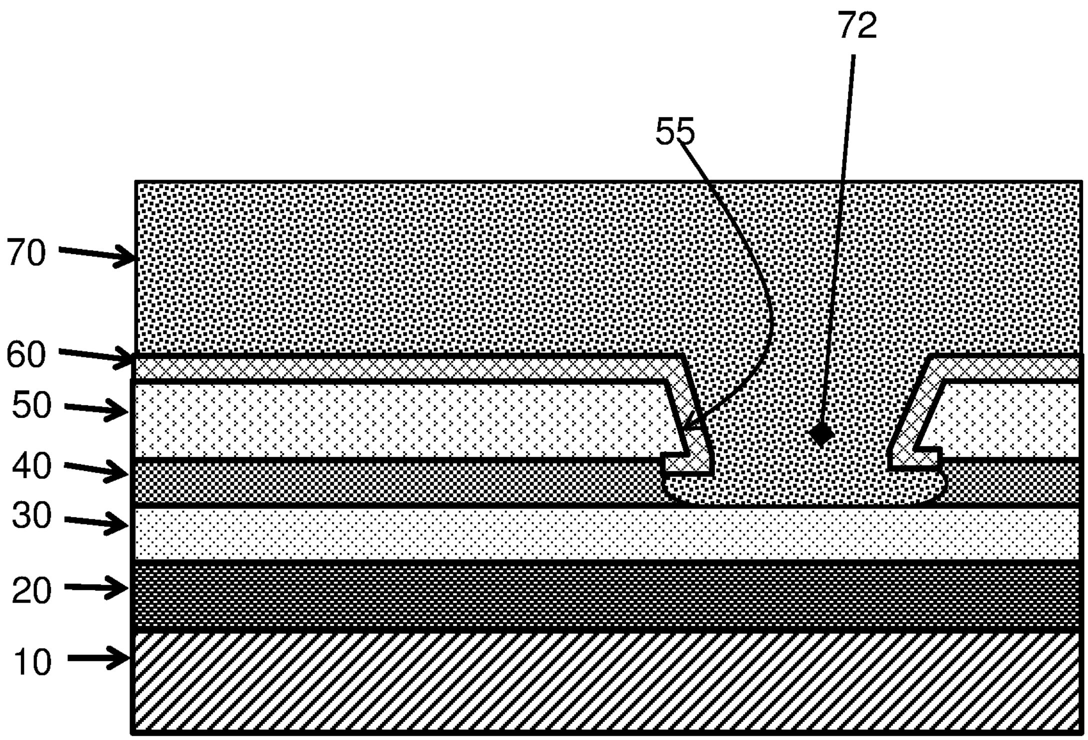
FIG. 13 shows a product obtained after the step of FIG. 12A, 12B.
Figure 14A:
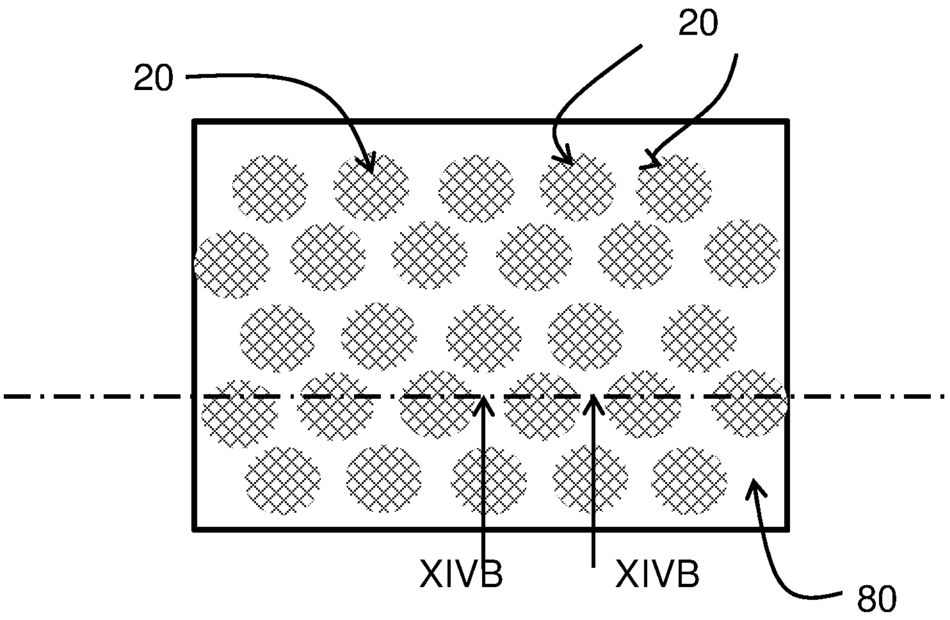
FIG. 14A shows a top-view corresponding to the area IIA of a semi-finished product obtained after an additional manufacturing step of a method according to the second aspect.
Figure 14B:
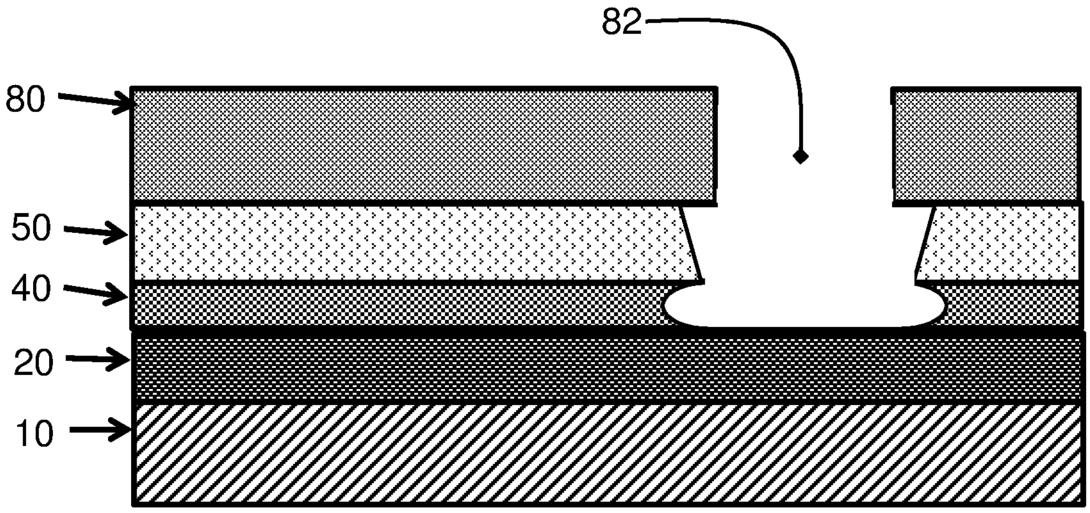
FIG. 14B shows a cross-section according to XIVB-XIVB in FIG. 14A.
Figure 15A:
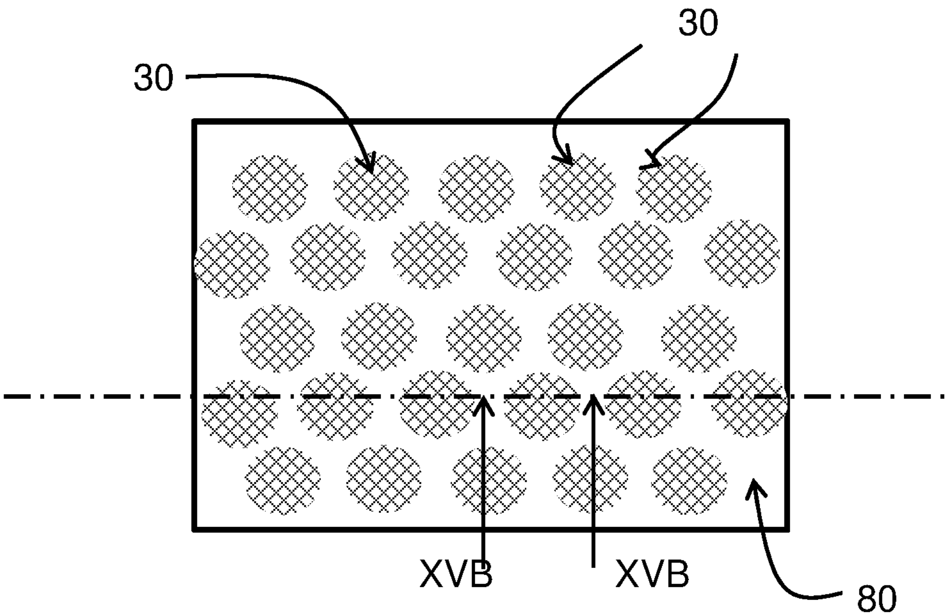
FIG. 15A shows a top-view corresponding to the area IIA of a semi-finished product obtained after an additional manufacturing step of a method according to the second aspect.
Figure 15B:
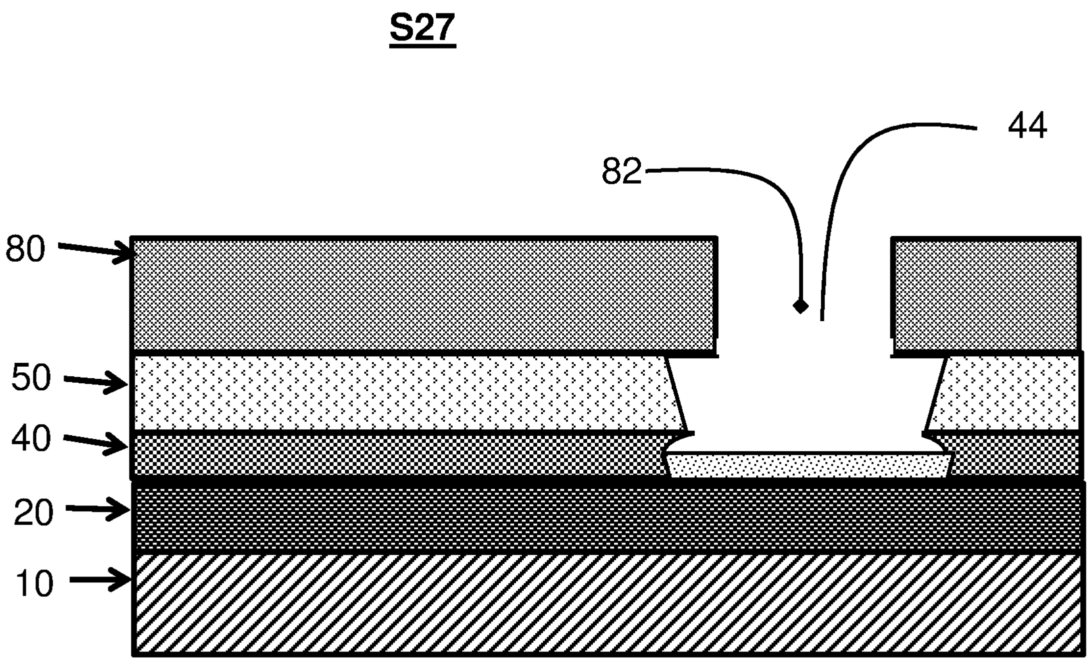
FIG. 15B shows a cross-section according to XVB-XVB in FIG. 15A.
Figure 16:
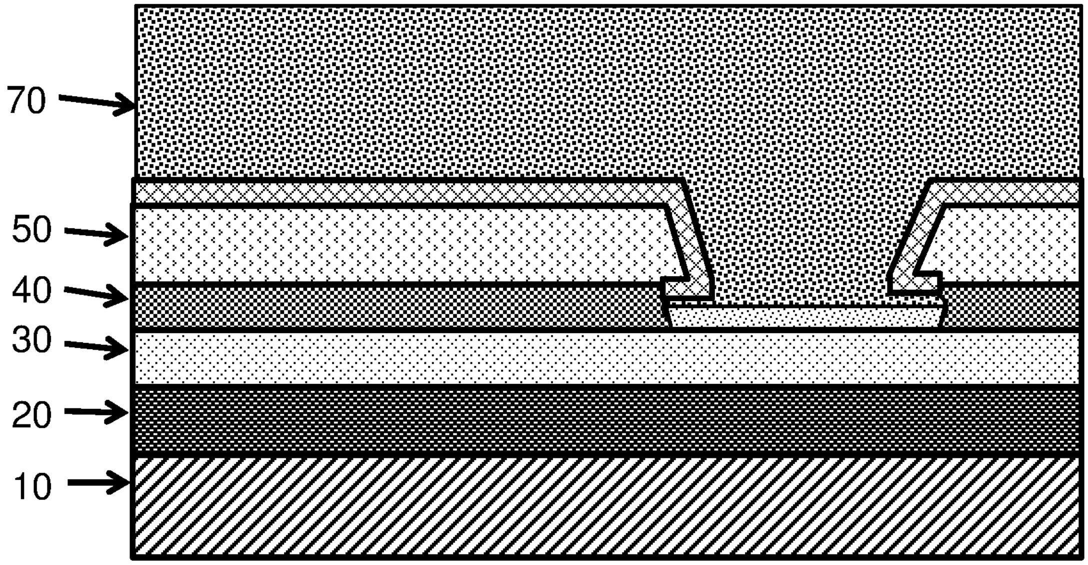
FIG. 16 shows a product obtained after the step of FIG. 15A, 15B.

The preparatory steps with which the semi-finished product as shown in FIG. 14A, 14B is obtained after step S26, differ from those used for the semi-finished product of FIG. 11A, 11B, in that no first charge-carrier transport layer 30 is deposited. Instead, in the subsequent step S27 as shown in FIG. 15A, 15B, the first charge-carrier transport layer 30 is deposited locally on the exposed portions of the surface of the first electrode layer 20, using an electroplating process. E.g. electroplating of an ETL like $SnO_2$ from a solution of 20 mM tin chloride ($SnCl_2$) and 75 mM nitric acid. Starting from here, also the second charge-carrier transport layer 60 can be deposited, as shown in FIG. 12A, 12B and a photo-electric conversion layer 70 can be deposited as shown in FIG. 13. The second charge carrier transport layer, in this case an HTL, may be deposited for example from CuSCN using a solution of $CuSO_4$/Nitrilotriacetic acid/KSCN. The product so obtained, as shown in FIG. 16, is characterized in that the first charge carrier layer 30 is absent in areas of the first electrode layer 20 covered by the insulating layer 40. In an alternative embodiment, electrodeposition may be used to deposit a hole transport layer as the first charge carrier transport layer 30 and to deposit an electron transport layer as the second charge carrier transport layer 60.

Figure 17A:
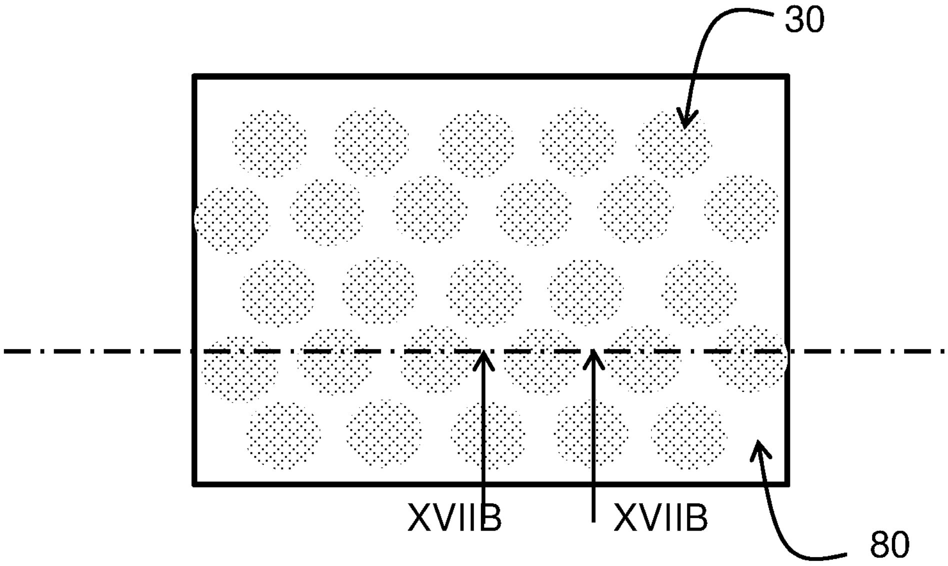
FIG. 17A shows a top-view corresponding to the area IIA of a semi-finished product obtained after an additional manufacturing step of a method according to the second aspect.
Figure 17B:
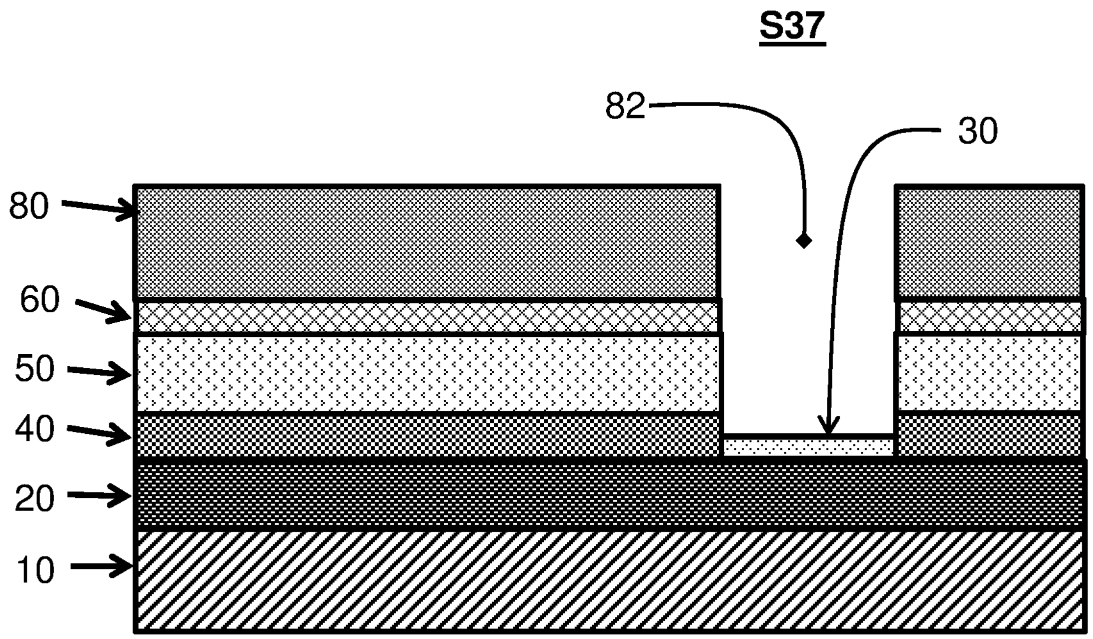
FIG. 17B shows a cross-section according to XVIIB-XVIIB in FIG. 17A.

It is still further possible that only the first charge-carrier layer 30 is deposited by electro-plating. For example, starting from a semi-finished product, differing from the semi-finished product of FIG. 2A, 2B, in that a first charge carrier transport layer 30 is absent, an opening may be formed in the layers 40, 50 and 60 in steps as described with reference to FIG. 3A, 3B, or as described with reference to FIG. 10A, 10B, 11A, 11B, and subsequently an electro-plating step S37 can be used to deposit a first charge carrier layer 30 on the exposed portions of the surface of the first electrode 20, as shown in FIG. 17A, 17B. Also in this case, the product which is obtained is characterized in that the first charge carrier layer 30 is absent in areas of the first electrode layer 20 covered by the insulating layer 40.

While the invention has been illustrated and described in detail in the drawings and foregoing description, such illustration and description are to be considered illustrative and exemplary and not restrictive; the invention is not limited to the disclosed embodiments. Other variations to the disclosed embodiments can be understood and effected by those skilled in the art in practicing the invention, from a study of the drawings, the disclosure and the appended claims.

In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. A method of manufacturing a photo-voltaic element, the method comprising:

providing a substrate;

depositing thereon a stack of layers comprising at least in the order named:

a first electrode layer for receiving charge carriers of a first polarity;

an insulating layer;

a second electrode layer for receiving charge carriers of second polarity opposite to said first polarity;

wherein the insulating layer and layers subsequently deposited in this step form a substack having an upper surface, applying a resist layer on said upper surface, wherein said resist layer is provided with a plurality of distributed openings towards said upper surface, the openings having an effective cross-section D in the range of 0.5 to 10 micron, and having an average pitch in the range of 1.1 to 5 times said effective cross-section, etching to selectively remove material of the sub-stack facing the openings, removing the resist layer subsequent to said etching, and depositing and curing a photo-electric conversion layer subsequent to said removing.

2. The method according to claim 1, further comprising:

depositing a first charge carrier transport layer for transport of charge carriers having said first polarity;

depositing a second charge carrier transport layer for transport of charge carriers having said second polarity.

3. The method according to claim 1, wherein:

a contact-surface of the photo-electric conversion layer with the first charge carrier transport layer has a first surface area, a contact-surface of the photo-electric conversion layer with the second charge carrier transport layer has a second surface area, and a ratio between the second surface area and the first surface area is approximately equal to a ratio between the first mobility and the second mobility.

4. The method according to claim 3, wherein said depositing a first charge carrier transport layer is subsequent to depositing the first electrode layer and preceding to depositing the insulating layer.

5. The method according to claim 3, wherein said depositing the second charge carrier transport layer is subsequent to depositing the insulating layer and preceding depositing the resist layer.

6. The method according to claim 3, wherein the second charge carrier transport layer is deposited with an electroplating process and subsequent to removing the resist layer, and preceding depositing and curing a photo-electric conversion layer.

7. The method according to claim 3, wherein the first charge carrier transport layer is deposited with an electroplating process.

8. The method according to claim 3, further comprising anodizing an edge surface of the second electrode layer resulting from said etching, said anodizing being performed prior to the step of depositing the photo-electric conversion layer.

9. The method according to claim 3, further comprising conformally depositing a layer of an insulating material subsequent to said step of etching and anisotropically etching said layer to remove the insulating material from the surface of the second charge carrier transport layer and from the surface portions of the first charge carrier transport layer within the openings while keeping a layer of the insulating material on the walls of the openings intact.

10. The method according to claim 3, further comprising depositing a growth layer subsequent to said step of etching and prior to the step of depositing the photo-electric conversion layer.

11. The method according to claim 3, further comprising depositing a barrier over said photo-electric conversion layer.

12. The method according to claim 11, wherein said barrier has a refractive index lower than a refractive index of said photo-electric conversion layer.

13. The method according to claim 11, comprising applying a light in coupling structure over said barrier.

14. The method according to claim 13, wherein said light in coupling structure comprises a plurality of light in coupling elements.

15. The method according to claim 1, wherein the photo-electric conversion layer is provided of a perovskite material or of copper indium gallium selenide (CIGS).

16. The method according to claim 2, wherein an edge portion of an upper surface of the first electrode layer is kept free from material of the first charge carrier transport layer and is provided with a first electrical contact and wherein an edge portion of an upper surface of the second electrode layer is kept free from material of the second charge carrier transport layer and is provided with a second electrical contact.

17. The method according to claim 2, wherein the first electrode layer, the first charge carrier transport layer, the insulating layer and the second electrode layer are provided as a plurality of layer segments.

18. The method according to claim 17, comprising providing the second charge carrier transport layer and the photo-electric conversion layer as continuous layers.

19. The method according to claim 17, wherein the first electrode layer comprises a first electrode layer segment in a first lateral sub-stack segment and another first electrode layer segment in a neighboring second lateral sub-stack segment and wherein the second electrode layer comprises a second electrode layer segment in a first lateral sub-stack segment and another second electrode layer segment in a second lateral sub-stack segment and wherein the second electrode layer segment of the first lateral sub-stack segment extends over the another first electrode layer segment in the neighboring sub-stack segment, therewith forming an electrical connection between the second electrode layer segment and the another first electrode layer segment.

20. The method according to claim 18, wherein the first electrode layer comprises a first electrode layer segment in a first lateral sub-stack segment and another first electrode layer segment in a neighboring second lateral sub-stack segment and wherein the second electrode layer comprises a second electrode layer segment in a first lateral sub-stack segment and another second electrode layer segment in a second lateral sub-stack segment and wherein the second electrode layer segment of the first lateral sub-stack segment extends over the another first electrode layer segment in the neighboring sub-stack segment, therewith forming an electrical connection between the second electrode layer segment and the another first electrode layer segment.

* * * * *